(12) United States Patent
Strongin et al.

(10) Patent No.: US 11,459,664 B2
(45) Date of Patent: Oct. 4, 2022

(54) MULTI-METAL CATALYSTS AND DEVICES AND METHODS OF USE THEREOF

(71) Applicant: Temple University-Of The Commonwealth System of Higher Education, Philadelphia, PA (US)

(72) Inventors: Daniel R. Strongin, Wynnewood, PA (US); Akila C. Thenuwara, Philadelphia, PA (US)

(73) Assignee: Temple University—Of The Commonwealth System of Higher Education, Philadelphia, PA (US)

( * ) Notice: Subject to any disclaimer, the term of this patent is extended or adjusted under 35 U.S.C. 154(b) by 202 days.

(21) Appl. No.: 16/632,602

(22) PCT Filed: Jul. 20, 2018

(86) PCT No.: PCT/US2018/042988
§ 371 (c)(1),
(2) Date: Jan. 21, 2020

(87) PCT Pub. No.: WO2019/018709
PCT Pub. Date: Jan. 24, 2019

(65) Prior Publication Data
US 2021/0164118 A1    Jun. 3, 2021

Related U.S. Application Data

(60) Provisional application No. 62/535,267, filed on Jul. 21, 2017.

(51) Int. Cl.
*B01J 23/28* (2006.01)
*B01J 23/75* (2006.01)
(Continued)

(52) U.S. Cl.
CPC .............. *C25B 11/075* (2021.01); *B01J 27/19* (2013.01); *C25B 1/04* (2013.01); *C25B 1/50* (2021.01);
(Continued)

(58) Field of Classification Search
CPC . B01J 23/28; B01J 23/75; B01J 23/882; B01J 27/19; C25B 11/052; C25B 11/061;
(Continued)

(56) References Cited

U.S. PATENT DOCUMENTS 3,749,664 A * 7/1973 Mickelson ............. C10G 45/08
208/217
3,755,196 A * 8/1973 Mickelson ............... B01J 27/19
502/211
(Continued)

FOREIGN PATENT DOCUMENTS

KR    100635302    10/2006

OTHER PUBLICATIONS

Chang, Christopher J. et al., "Electrodeposited Cobalt-Sulfide Catalyst for Electrochemical and Photoelectrochemical Hydrogen Generation from Water", J. Am. Chem. Soc., 2013, 135:17699-17702.
(Continued)

*Primary Examiner* — Cam N. Nguyen
(74) *Attorney, Agent, or Firm* — Riverside Law LLP

(57) ABSTRACT

Novel multi-metal catalysts comprising abundant Earth metals are described herein. Devices comprising the catalysts of the invention are also described.
Methods of producing the catalysts are also described herein.
Methods of producing hydrogen using the catalysts of the invention are also described herein.

16 Claims, 15 Drawing Sheets

(51) Int. Cl.
| | |
|---|---|
| B01J 23/882 | (2006.01) |
| B01J 27/19 | (2006.01) |
| C25B 11/052 | (2021.01) |
| C25B 11/061 | (2021.01) |
| C25B 11/075 | (2021.01) |
| C25B 1/04 | (2021.01) |
| C25B 1/50 | (2021.01) |
| C25D 9/08 | (2006.01) |
| H01L 31/0224 | (2006.01) |
| H01M 4/90 | (2006.01) |
| B01J 37/02 | (2006.01) |

(52) U.S. Cl.
CPC .......... *C25B 11/052* (2021.01); *C25B 11/061* (2021.01); *C25D 9/08* (2013.01); *H01L 31/022425* (2013.01); *H01M 4/90* (2013.01); *B01J 37/0225* (2013.01)

(58) Field of Classification Search
CPC ........... C25B 11/075; C25B 1/04; C25B 1/50; C25D 9/08; H01L 31/022425; H01M 4/90
See application file for complete search history.

(56) References Cited

U.S. PATENT DOCUMENTS

| | | | | |
|---|---|---|---|---|
| 5,569,545 | A * | 10/1996 | Yokono | B32B 15/08 428/626 |
| 8,361,288 | B2 * | 1/2013 | Reece | C25B 1/04 429/525 |
| 9,724,896 | B2 * | 8/2017 | Momoi | B32B 15/08 |
| 10,112,182 | B2 * | 10/2018 | Leflaive | C10G 45/02 |
| 10,123,433 | B2 * | 11/2018 | Moriyama | H05K 3/4682 |
| 10,178,775 | B2 * | 1/2019 | Miyoshi | C25D 5/627 |
| 10,187,983 | B2 * | 1/2019 | Kohiki | H05K 1/09 |
| 10,201,092 | B2 * | 2/2019 | Nagaura | C25D 5/14 |
| 10,251,283 | B2 * | 4/2019 | Miyamoto | H05K 3/025 |
| 10,299,385 | B2 * | 5/2019 | Miyamoto | H05K 3/4038 |
| 10,332,756 | B2 * | 6/2019 | Moriyama | C25D 1/04 |
| 10,349,531 | B2 * | 7/2019 | Miyamoto | H05K 3/4007 |
| 10,356,898 | B2 * | 7/2019 | Miyamoto | H05K 1/09 |
| 10,464,291 | B2 * | 11/2019 | Momoi | B32B 15/20 |
| 10,563,134 | B2 * | 2/2020 | Bhan | B01J 35/1076 |
| 2015/0259810 | A1 | 9/2015 | Lewis | |
| 2016/0183380 | A1 * | 6/2016 | Ishii | H05K 3/205 156/247 |
| 2017/0303405 | A1 * | 10/2017 | Fukuchi | H05K 1/0237 |
| 2017/0362733 | A1 * | 12/2017 | Kohiki | H05K 3/025 |
| 2018/0279482 | A1 * | 9/2018 | Ishii | H05K 3/205 |

OTHER PUBLICATIONS

Asefa, T. et al., "Cobalt Embedded Nitrogen Rich Carbon Nanotubes Efficiently Catalyze Hydrogen Evolution Reaction at All pH Values", Angew. Chemie, 2014, 53:4372-4376.
Schaak, Raymond E., et al., "Nanostructured Nickel Phosphide as an Electrocatalyst for the Hydrogen Evolution Reaction", J. Am. Chem. Soc. 2013, 135:9267-9270.
Markovic, Nenad M. et al., "Enhancing the Alkaline Hydrogen Evolution Reaction Activity through the Bifunctionality of Ni(OH)2/Metal Catalysts", Angew. Chemie, 2012, 51:12495-12498.
Hu, Xile et al., "Molybdenum boride and carbide catalyze hydrogen evolution in both acidic and basic solutions", Angew. Chem., 2012, 51:12703-12706.
Hu, Xile et al. "Photoelectrochemical Hydrogen Production in Alkaline Solutions Using Cu2O Coated with Earth Abundant Hydrogen Evolution Catalysts", Angew. Chemie, 2015, 54:664-667.
Hu, Xile et al. "Amorphous molybdenum sulfide films as catalysts for electrochemical hydrogen production in water", Chem. Sci., 2011, 2:1262-1267.
Du, Pingwu et al., "A robust hydrogen evolution catalyst based on crystalline nickel phosphide nanoflakes on three-dimensional graphene/nickel foam: high performance for electrocatalytic hydrogen production from pH 0-14", J. Materials Chemistry A, 2015, 3: 1941-1946.
Cox, P. M. et al., "Acceleration of global warming due to carbon-cycle feedbacks in a coupled climate model", Nature, 2000, 408:184-187.
Gray, H. B., "Powering the planet with solar fuel", Nat. Chem., 2009, 1:7-7.
Bard, A. J. et al., "Artificial Photosynthesis: Solar Splitting of Water to Hydrogen and Oxygen", Acc. Chem. Res., 1995, 28:141-145.
Morales-Guio, C. G. et al., "Nanostructured hydrotreating catalysts for electrochemical hydrogen evolution", Chem. Soc. Rev., 2014, 43:6555-6569.
Shi, Y. et al., "Recent advances in transition metal phosphide nanomaterials: synthesis and applications in hydrogen evolution reaction", Chem. Soc. Rev., 2016, 45:1529-1541.
Zou, X. et al., "Noble metal-free hydrogen evolution catalysts for water splitting", Chem. Soc. Rev., 2015, 44:5148-5180.
Vesborg, P. C. K. et al., "Recent Development in Hydrogen Evolution Reaction Catalysts and Their Practical Implementation", J. Phys. Chem. Lett., 2015, 6:951-957.
Montoya, J. H. et al., "Materials for solar fuels and chemicals", Nat. Mater., 2017, 16:70-81.
Thenuwara, A. C. et al., "Intercalation of Cobalt into the Interlayer of Birnessite Improves Oxygen Evolution Catalysis", ACS Catal., 2016, 6:7739-7743.
Thenuwara Akila, C. et al., "Nickel Confined in the Interlayer Region of Birnessite: an Active Electrocatalyst for Water Oxidation" Angewandte Chemie International Edition, 2016, 55:10381-10385.
Gong, M. et al., "A mini review on nickel-based electrocatalysts for alkaline hydrogen evolution reaction", Nano Res., 2016, 9:28-46.
Birry, L. et al., "Studies of the Hydrogen Evolution Reaction on Raney Nickel—Molybdenum Electrodes", J. Appl. Electrochem., 2004, 34:735-749.
Subbaraman, R. et al., "Enhancing Hydrogen Evolution Activity in Water Splitting by Tailoring Li+—Ni(OH) 2-Pt interfaces", Science, 2011, 334:1256.
Jiang, J. et al., "Hollow Chevrel-Phase NiMo3S4 for Hydrogen Evolution in Alkaline Electrolytes", Angew. Chem. Int. Ed., 2016, 55:15240-15245.
Zhang, J. et al., "Engineering water dissociation sites in MoS2 nanosheets for accelerated electrocatalytic hydrogen production", Energy Environ. Sci., 2016, 9:2789-2793.
Jiang, N. et al., "Electrodeposited Cobalt-Phosphorous-Derived Films as Competent Bifunctional Catalysts for Overall Water Splitting", Angew. Chem. Int. Ed., 2015, 54:6251-6254.
Jiang, N. et al., "Bifunctionality and Mechanism of Electrodeposited Nickel-Phosphorous Films for Efficient Overall Water Splitting", ChemCatChem., 2016, 8:106-112.
Bajdich, M. et al., "Theoretical Investigation of the Activity of Cobalt Oxides for the Electrochemical Oxidation of Water", J. Am. Chem. Soc.,2013, 135:13521-13530.
Seh, Z. W. et al., "Combining theory and experiment in electrocatalysis: Insights into materials design", Science, 2017, 355.
Friebel, D. et al., "Identification of Highly Active Fe Sites in (Ni,Fe)OOH for Electrocatalytic Water Splitting", J. Am. Chem. Soc., 2015, 137:1305-1313.
Thenuwara, A. C. et al., "Cobalt Intercalated Layered NiFe Double Hydroxides for the Oxygen Evolution Reaction", The Journal of Physical Chemistry B, 2018, 122:847-854.
Zhang, B. et al., "Homogeneously dispersed multimetal oxygen-evolving catalysts", Science, 2016, 352:333.
Liu, T. et al., "Mn Doping of CoP Nanosheets Array: An Efficient Electrocatalyst for Hydrogen Evolution Reaction with Enhanced Activity at All pH Values", ACS Catal., 2017, 7:98-102.
Xing, J. et al., "Electro-synthesis of 3D porous hierarchical Ni—Fe phosphate film/Ni foam as a high-efficiency bifunctional electrocatalyst for overall water splitting", J. Mat. Chem. A, 2016, 4:13866-13873.

(56) References Cited

OTHER PUBLICATIONS

Markovica, N. M. et al., "Hydrogen electrochemistry on platinum low-index single-crystal surfaces in alkaline solution", J. Chem. Soc. Faraday Trans., 1996, 92:3719-3725.

Wang, P. et al., "Phase and Interface Engineering of Platinum-Nickel Nanowires for Efficient Electrochemical Hydrogen Evolution", Angew. Chem. Int. Ed., 2016, 128:13051-13055.

Yu, X. et al., "Hydrogen Evolution Reaction in Alkaline Media: Alpha- or Beta-Nickel Hydroxide on the Surface of Platinum?", ACS Energy Lett., 2018, 3:237-244.

Zhang, J. et al., "Efficient hydrogen production on MoNi4 electrocatalysts with fast water dissociation kinetics", Nat. Commun., 2017, 8:15437.

Subbaraman, R. et al., "Trends in activity for the water electrolyser reactions on 3d M(Ni,Co,Fe,Mn) hydr(oxy)oxide catalysts", Nat. Mater., 2012, 11:550-557.

Grosvenor, A. P. et al., "Examination of the Bonding in Binary Transition-Metal Monophosphides MP (M = Cr, Mn, Fe, Co) by X-Ray Photoelectron Spectroscopy", Inorg. Chem., 2005, 44:8988-8998.

Xiao, P. et al., "Molybdenum phosphide as an efficient electrocatalyst for the hydrogen evolution reaction", Energy Environ. Sci., 2014, 7:2624-2629.

Ma, Y.-Y. et al., "Highly efficient hydrogen evolution from seawater by a low-cost and stable CoMoP@C electrocatalyst superior to Pt/C", Energy Environ. Sci., 2017, 10:788-798.

Fang, S.-L. et al., "Enhanced hydrogen evolution reaction on hybrids of cobalt phosphide and molybdenum phosphide", Royal Soc. Open Sci., 2017, 4.

Yoon, Y. et al., "Suppressing Ion Transfer Enables Versatile Measurements of Electrochemical Surface Area for Intrinsic Activity Comparisons", J. Am. Chem. Soc., 2018, 140:2397-2400.

Valladares, A. A. et al., "Computer Modeling of Nanoporous Materials: An ab initio Novel Approach for Silicon and Carbon", Mater. Res. Soc. Symp. Proc., 2007, 988:97-102.

Zheng, J. et al., "Universal dependence of hydrogen oxidation and evolution reaction activity of platinum-group metals on pH and hydrogen binding energy", Sci. Adv., 2016, 2, 8 pages.

Xu, Z. et al., "In-Situ Formed Hydroxide Accelerating Water Dissociation Kinetics on Co3N for Hydrogen Production in Alkaline Solution", ACS Appl. Mater. Interfaces, 2018, 10:22102-22109.

Li, Qing et al., "One-step Electrodeposition of Co/CoP Film on Ni Foam for Efficient Hydrogen Evolution in Alkaline Solution", ACS Applied Materials & Interfaces, 2016, 8:29400-29407.

Kublanovsky, V. et al., "Cobalt-Molybdenum-Phosphorus Alloys: Electroplating and Corrosion Properties", Protection of Metals and Physical Chemistry of Surfaces, 2009, 45:588-594.

Tian, Jingqi et al., "Self-Supported Nanoporous Cobalt Phosphide Nanowire Arrays: An Efficient 3D Hydrogen-Evolving Cathode Over the Wide Range of pH 0-14", J. Am. Chem. Soc., 2014, 136:7587-7590.

Liang, Yanhui et al., "Self-Supported FeP Nanorod Arrays: A Cost-Effective 3D Hydrogen Evolution Cathode with High Catalytic Activity", ACS Catalysis, 2014, 4:4065-4069.

McKone, James R. et al., "Ni—Mo Nanopowders for Efficient Electrochemical Hydrogen Evolution", ACS Catalysis, 2013, 3:166-169.

\* cited by examiner

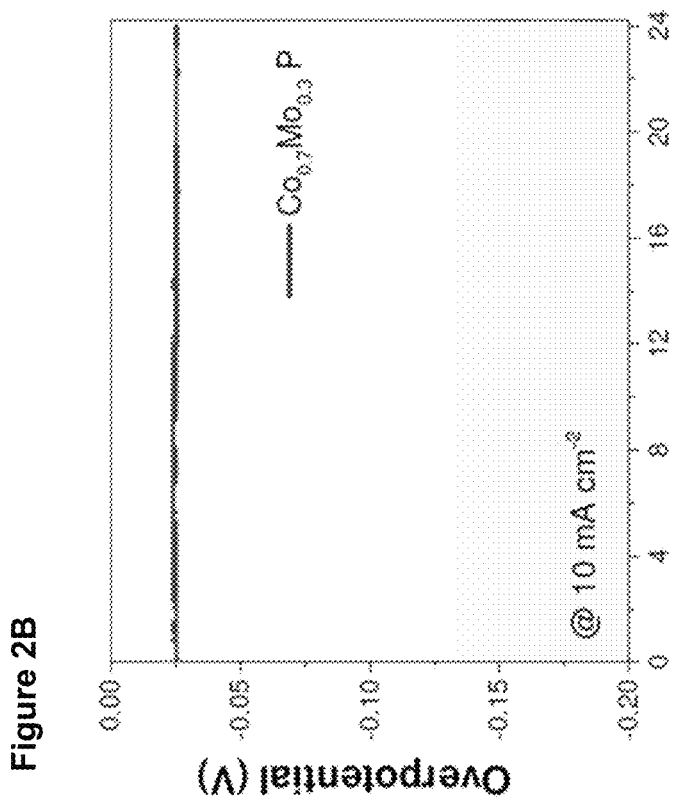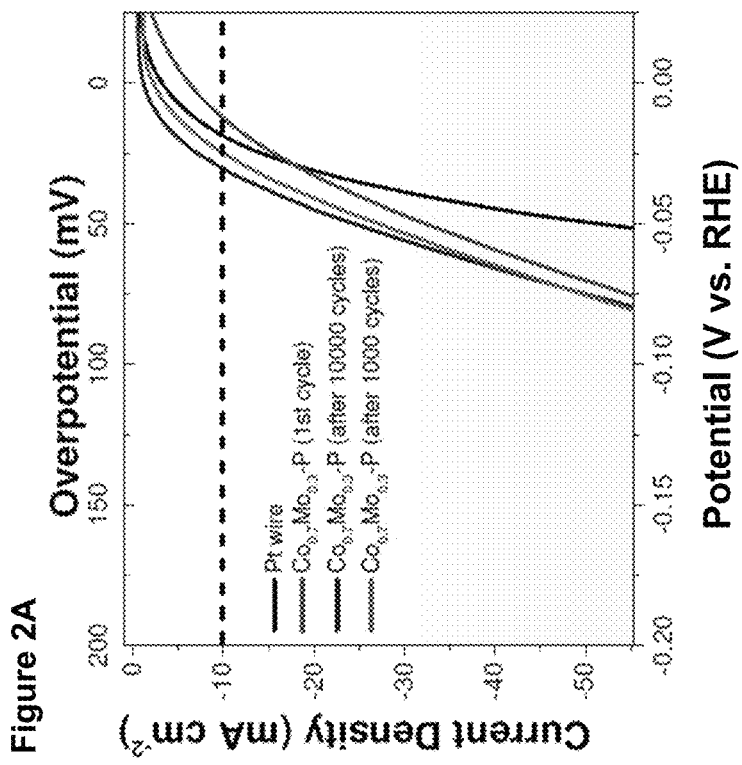
Figure 2

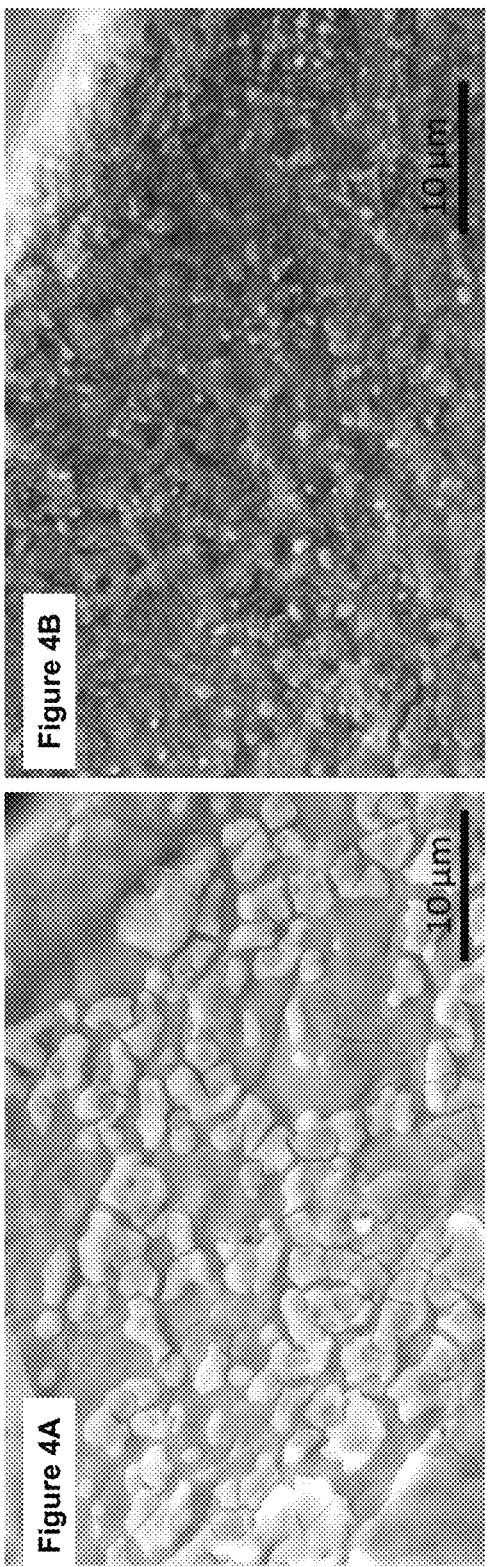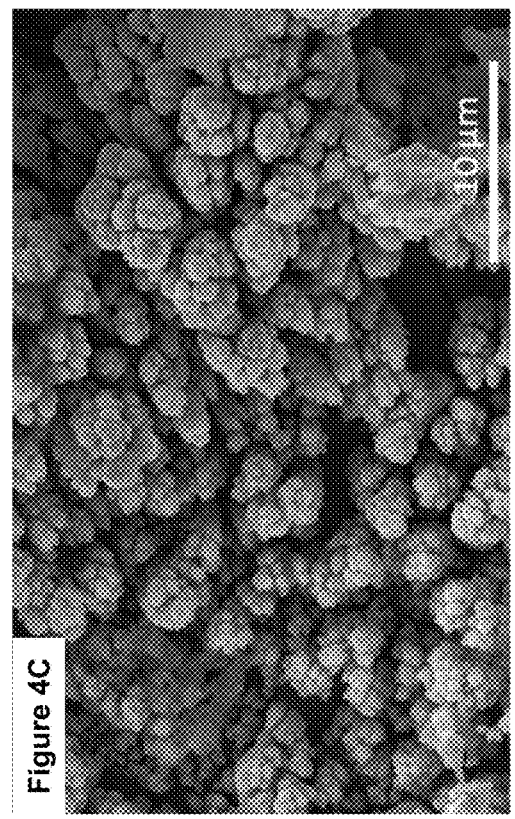
Figure 4

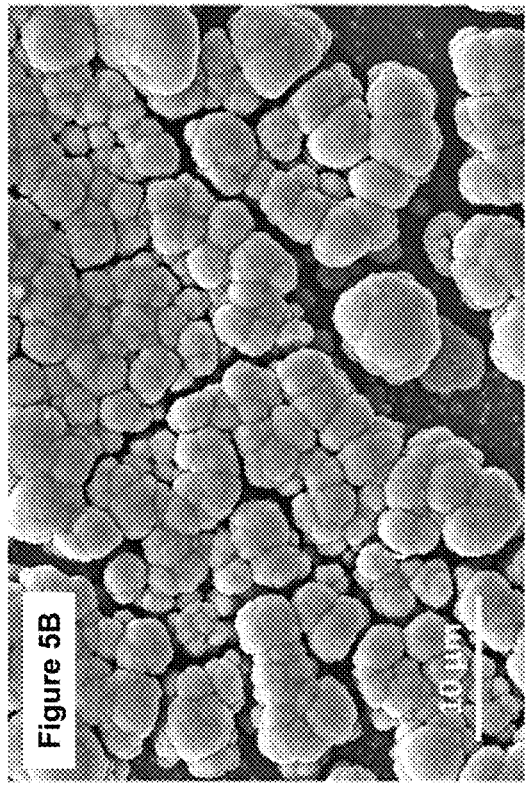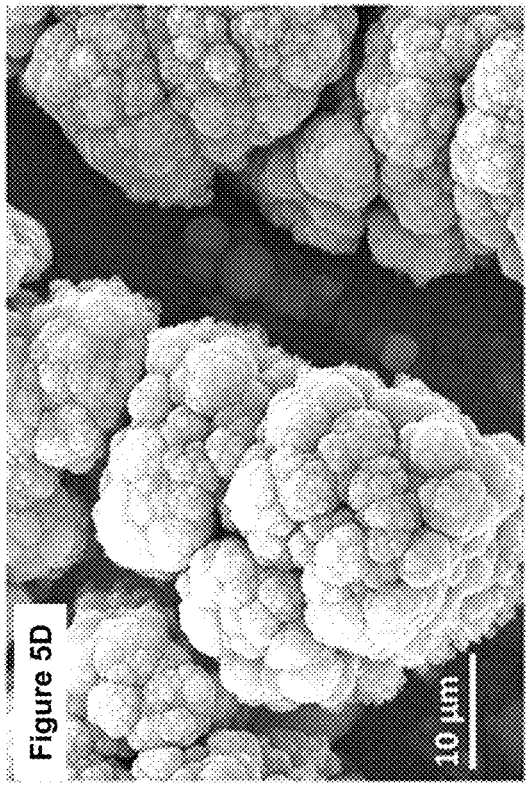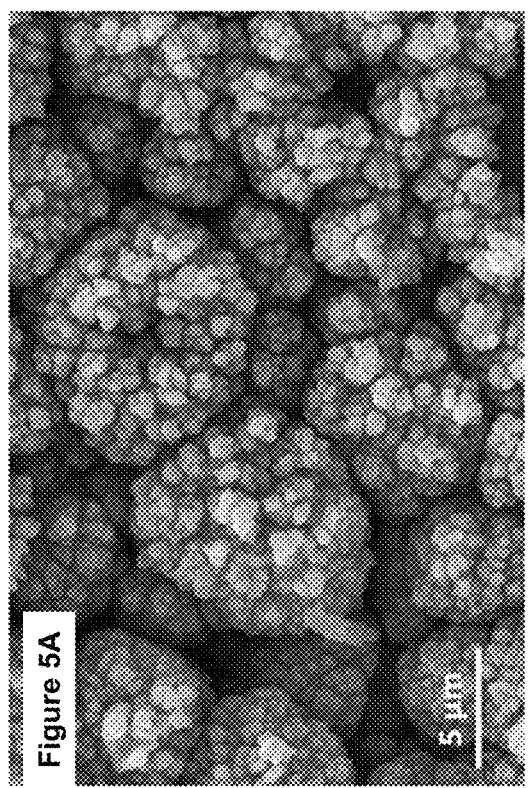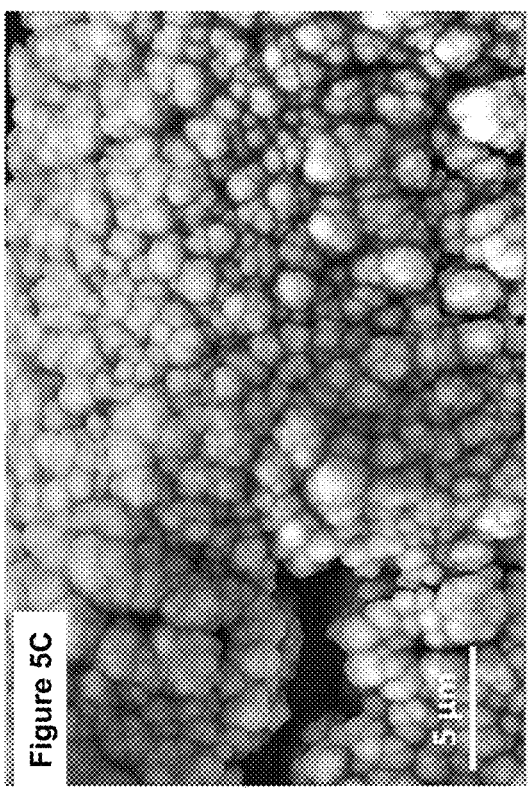
Figure 5

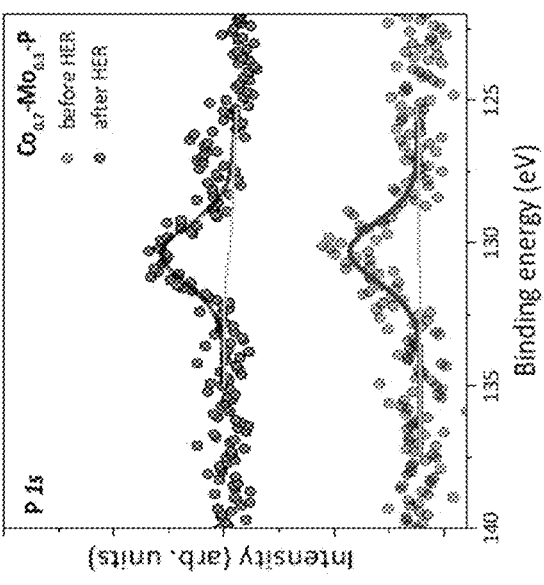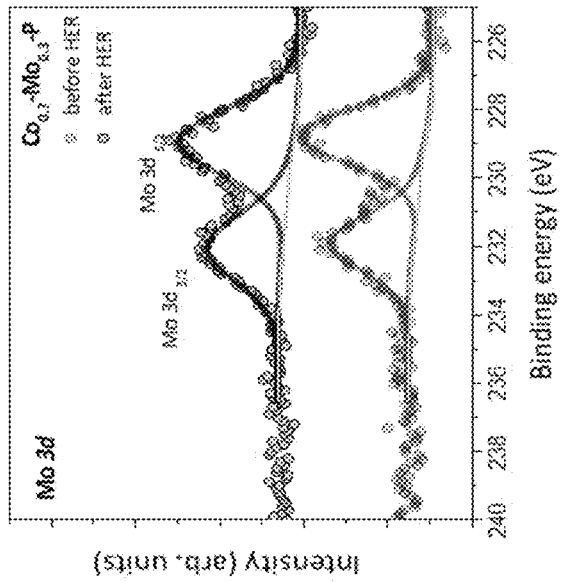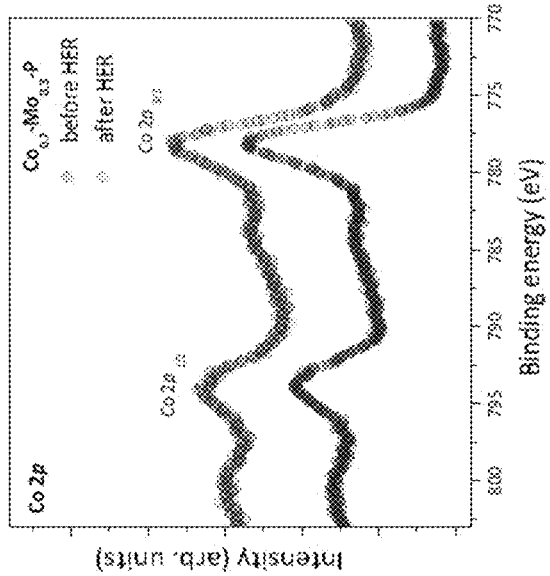
Figure 10

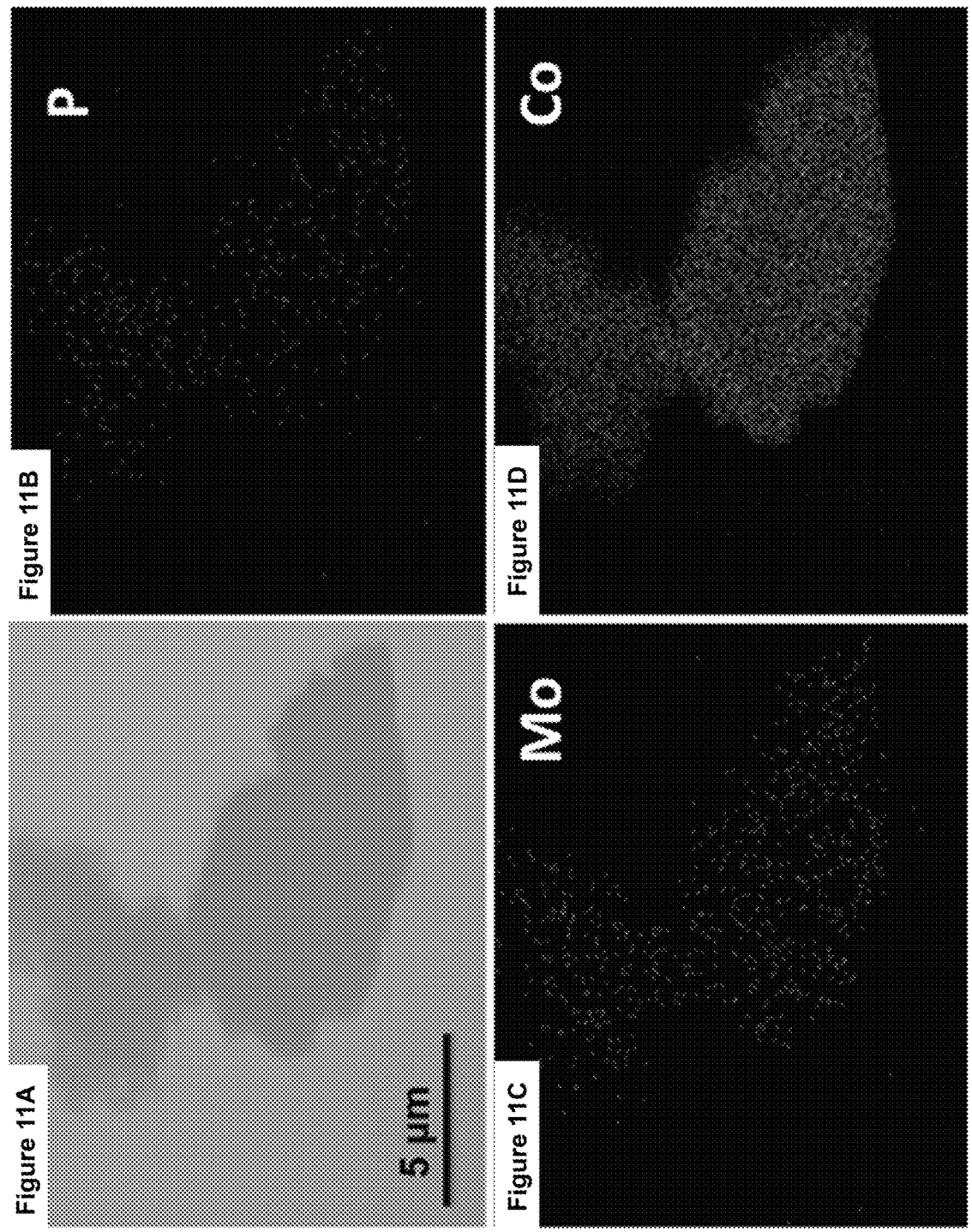

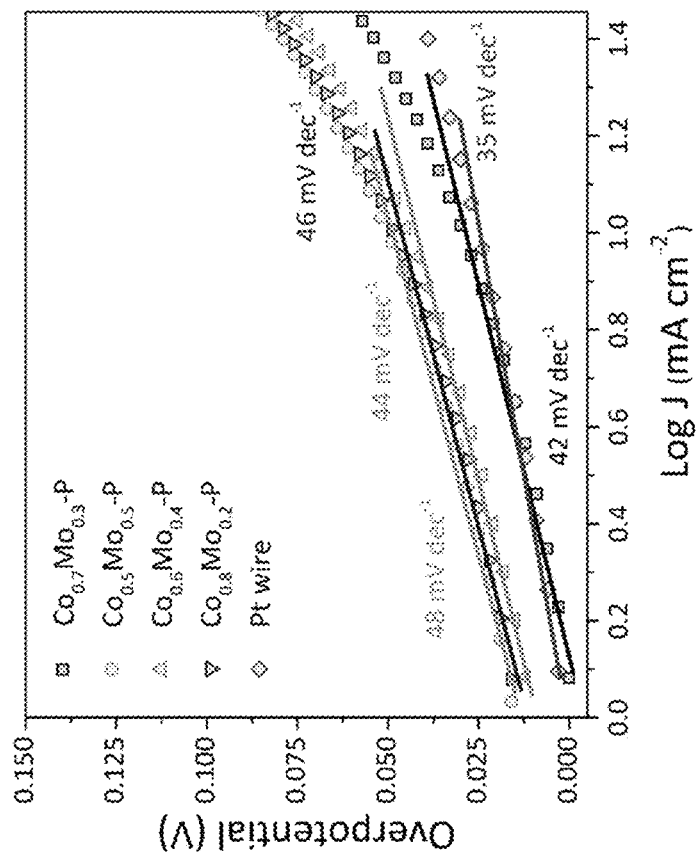
Figure 12B
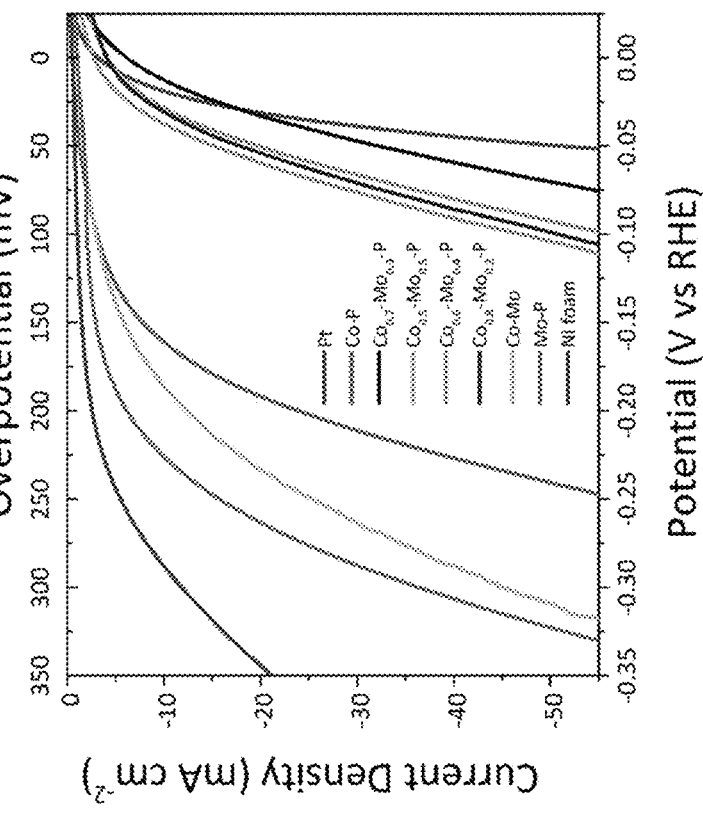
Figure 12A
Figure 12

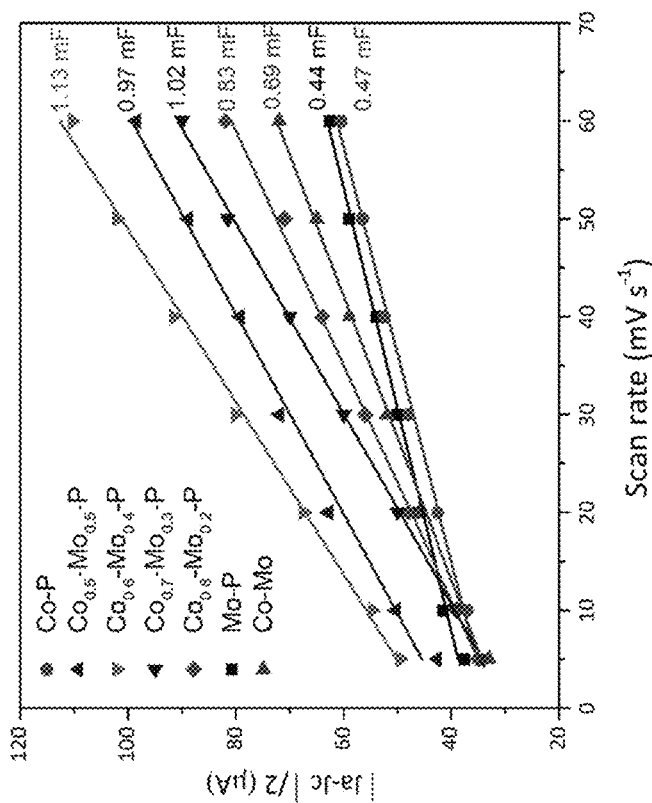
Figure 12E
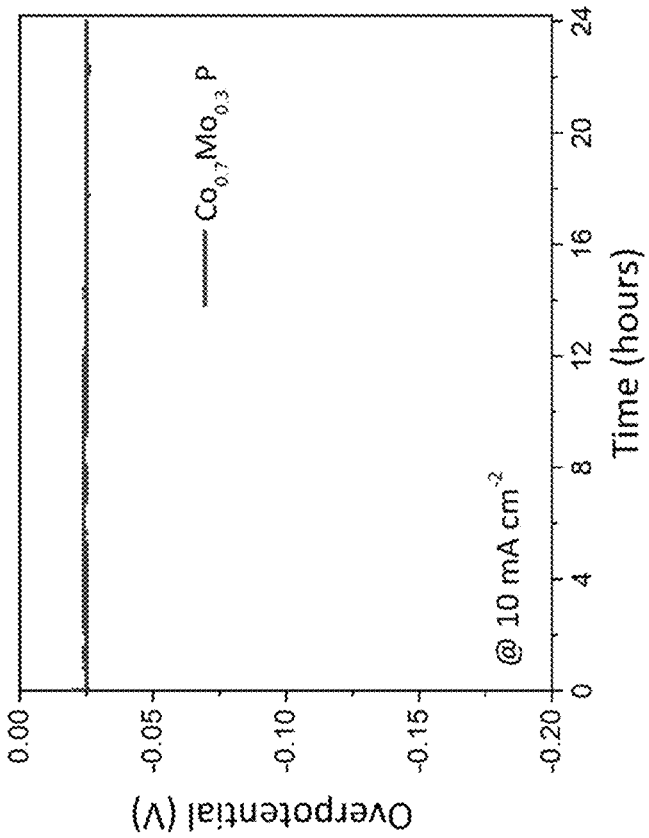
Figure 12F
Figure 12 Cont.

MULTI-METAL CATALYSTS AND DEVICES AND METHODS OF USE THEREOF

CROSS-REFERENCE TO RELATED APPLICATIONS

The present application is a 35 U.S.C. § 371 national stage patent application of International Patent Application No. PCT/US2018/042988, filed Jul. 20, 2018, which claims priority under 35 U.S.C. § 119(e) to U.S. Provisional Patent Application Ser. No. 62/535,267, filed Jul. 21, 2017, all of which are incorporated herein by reference in their entireties.

STATEMENT REGARDING FEDERALLY SPONSORED RESEARCH OR DEVELOPMENT

This invention was made with government support under grant no. DE-SC0012575 awarded by the Department of Energy. The government has certain rights in the invention.

BACKGROUND OF THE INVENTION

Global climate change and diminishing oil reserves argue for the global community to move beyond fossil fuels and look for alternative sources of sustainable green energy (Cox et al., Nature, 2000, 408:184-187). Hydrogen is one of the most important green, renewable energy sources and shows great promise as the next potential replacement for fossil fuels if cost effective mass production of the molecule is realized (Gray, Nat. Chem., 2009, 1:7). In this regard, discovery of economical hydrogen evolution catalysts made from Earth-abundant materials plays a pivotal role in this realization (Gray, Nat. Chem., 2009, 1:7; Bard et al., Acc. Chem. Res., 1995, 28:141-145). In the context of a hydrogen economy, research across the globe has been interested in developing Earth-abundant catalysts for hydrogen evolution from the electrolysis of water (i.e., water splitting).

Much effort has been dedicated over the years to discover, understand and optimize cost-effective electrocatalysts to drive the hydrogen evolution reaction (HER), which is the reduction half reaction in the overall water spitting reaction (Morales-Guio et al., Chem. Soc. Rev., 2014, 43:6555-6569; Shi et al., Chem. Soc. Rev., 2016, 45:1529-1541; Zou et al., Chem. Soc. Rev., 2015, 44:5148-5180). Prior work on HER has shown that transition metal based sulfides, carbides and phosphides are some of the most effective materials for acidic hydrogen evolution (Zou et al., Chem. Soc. Rev., 2015, 44:5148-5180; Vesborg et al., J. Phys. Chem. Lett., 2015, 6:951-957). However, to implement HER at the industrial scale, both HER and the oxidation half reaction, the oxygen evolution reaction (OER), should be efficient in the same medium (Montoya et al., Nat. Mater., 2017, 16:70-81; Thenuwara et al. ACS Catal., 2016, 6:7739-7743; Thenuwara et al., Angew. Chem. Int. Ed., 2016, 55:10381-10385). Thus, when choosing a solution medium to split water and generate hydrogen, an alkaline medium is preferred, since many inexpensive OER catalysts fail in acidic medium (Gong et al., Nano Res., 2016, 9:28-46). Almost all of the present commercial methods to carry out the electrolysis of water use expensive precious metal platinum ($927 per ounce) as the hydrogen evolving catalyst. Thus, research across the globe has focused on making an electrocatalyst, composed of Earth-abundant elements, to generate hydrogen during the electrolysis of water (typically under alkaline conditions) that could compete with the efficiency of platinum. Thus, a cheap inexpensive catalyst is essential to drop the price of hydrogen gas production (from water electrolysis).

Compared with acidic HER electrocatalysts, alkaline HER electrocatalysts have attracted limited research attention and the discovery of novel materials is rarely reported (Gong et al., Nano Res., 2016, 9:28-46). Currently, commercial alkaline electrolyzes use high surface area Raney Ni or its derivatives, but these materials exhibit a considerable overpotential and long term stability issues (Biry et al., J. Appl. Electrochem., 2004, 34:735-749; Subbaraman et al., Science, 2011, 334:1256). Recent examples of successful Earth-abundant metal based alkaline HER electrocatalysts include Chevrel-phase ternary sulfides (overpotential of ~250 mV at 10 mA cm$^{-2}$) (Jiang et al., Angew. Chem. Int. Ed., 2016, 55:15240-15245). Ni doped $MoS_2$ nanosheets (overpotential of ~98 mV at 10 mA cm$^{-2}$) (Zhang et al., Energy Environ. Sci., 2016, 9:2789-2793) and electrodeposited amorphous cobalt-phosphorous-derived (Co—P)/nickel-phosphorous-derived (Ni—P) alloys (overpotential of ~100 mV at 10 mA cm$^{-2}$) (Jiang et al., Angew. Chem. Int. Ed., 2015, 54, 6251-6254; Jiang et al., Chem Cat Chem., 2016, 8:16-112).

There is a need in the art for novel, inexpensive catalysts made from Earth-abundant materials that can efficiently generate hydrogen from the electrolysis of water. The present invention addresses this unmet need.

BRIEF DESCRIPTION OF THE DRAWINGS

The following detailed description of preferred embodiments of the invention will be better understood when read in conjunction with the appended drawings.

FIG. 2, comprising FIGS. 2A-2B, depicts experimental data demonstrating the stability investigation of a $Co_{0.7}Mo_{0.3}$—P film. FIG. 2A depicts a graph of experimental data demonstrating the stability investigation with electrochemical cycles. FIG. 2B depicts a graph of experimental data demonstrating chronopotentiometric measurement at a constant current density of 10 mA cm.

FIG. 4, comprising FIGS. 4A-4C, depicts scanning electron microscopy (SEM) images of alloys. FIG. 4A depicts an SEM image of an Mo—P alloy. FIG. 4B depicts an SEM image of a Co—Mo alloy. FIG. 4C depicts an SEM image of a Co—P alloy.

FIG. 5, comprising FIGS. 5A-D, depicts the morphology of Co—Mo—P. FIG. 5A depicts an SEM image of $Co_{0.5}$—$Mo_{0.5}$—P. FIG. 5B depicts an SEM image of $Co_{0.6}$—$Mo_{0.4}$—P. FIG. 5C depicts an SEM image of $Co_{0.7}$—$Mo_{0.3}$—P. FIG. 5D depicts an SEM image of $Co_{0.8}$—$Mo_{0.2}$—P.

FIGS. 9A-9B, depicts characterization of $Co_{0.7}$—$Mo_{0.3}$—P. FIG. 9A depicts a transmission electron microscopy (TEM) image of $Co_{0.7}$—$Mo_{0.3}$—P. FIG. 9B depicts a selected area electron diffraction pattern (SAED) for $Co_{0.7}$—$Mo_{0.3}$—P. The lack of diffraction spots in SAED also suggest that the structure of the material is amorphous.

FIG. 10, comprising FIGS. 10A-10C, depicts chemical state characterization of Co—Mo—P. FIG. 10A depicts X-ray photoelectron spectroscopy (XPS) spectra of Co 2p regions of $Co_{0.7}$—$Mo_{0.3}$—P before and after HER. FIG. 10B depicts XPS spectra of Mo 3d regions of $Co_{0.7}$—$Mo_{0.3}$—P before and after HER. FIG. 10C depicts XPS spectra of P is regions of $Co_{0.7}$—$Mo_{0.3}$—P before and after HER.

FIG. 11, comprising FIGS. 11A-11D, depicts characterization of $Co_{0.7}$—$Mo_{0.3}$—P. FIG. 11A depicts a scanning transmission electron microscopy (STEM) image of $Co_{0.7}$—$Mo_{0.3}$—P. FIG. 11B depicts an elemental map for P. FIG. 11C depicts an elemental map for Mo. FIG. 11D depicts an elemental map for Co.

FIGS. 12A-12F, depicts electrochemical analysis of Co—Mo—P along with Co—P and Pt wire for comparison. FIG. 12A depicts polarization curves using a standard three electrode configuration (graphite counter electrode). FIG. 12B depicts Tafel curves. FIG. 12C depicts polarization curves recorded from a two electrode configuration where 20% Ir/C was used as the anode and Pt, $Co_{0.7}$—$Mo_{0.3}$—P was used as the cathode. FIG. 12D depicts a durability test of $Co_{0.7}$—$Mo_{0.3}$—P using cyclic voltammetry. FIG. 12E depicts long term stability for $Co_{0.7}$—$Mo_{0.3}$—P using chronopotentiometry at 10 mA cm$^{-2}$ for 24 h. FIG. 12F shows plots of the differences between anodic and cathodic current (ja-jc) at an open circuit potential versus scan rate, which was used to determine the double layer capacitance of the electrocatalysts.

SUMMARY OF THE INVENTION

Figure 1:
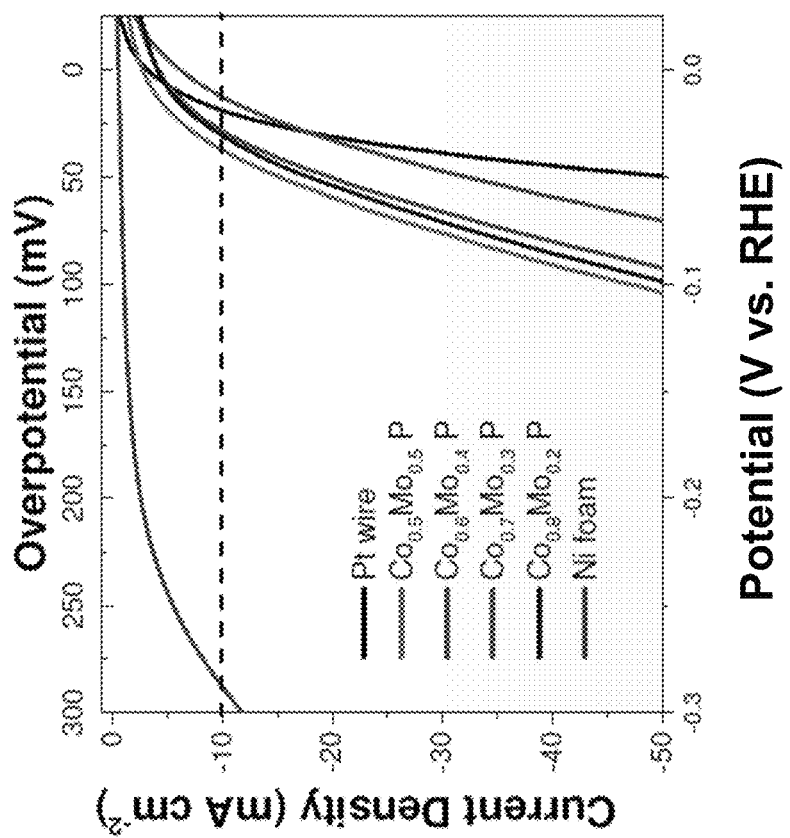
FIG. 1 depicts a graph of experimental data demonstrating polarization curves of electrodeposited Co—Mo phosphorous films on nickel foam (substrate) and Pt wire in a 1 M KOH solution.

In one aspect, the present invention relates to A catalyst of formula I: $Co_xMo_yP$ (formula I), wherein: x ranges from about 0.4 to 1.0, and y ranges from about 0.1 to 0.5. In one embodiment, x ranges from about 0.5 to 0.9, and y ranges from 0.2 to 0.4. In one embodiment, x is about 0.7, and y is about 0.3. In one embodiment, the catalyst is a film. In one embodiment, the film is applied on a substrate. In one embodiment, the substrate is selected from the group consisting of copper foil and nickel foam.

The present invention also relates to an electrode comprising a substrate and a catalyst on at least a portion of the surface of the substrate, wherein the catalyst is a catalyst of formula I: $Co_xMo_yP$ (formula I), wherein: x ranges from about 0.4 to 1.0, and y ranges from about 0.1 to 0.5. In one embodiment, x ranges from about 0.5 to 0.9, and y ranges from 0.2 to 0.4. In one embodiment, x is about 0.7, and y is about 0.3. In one embodiment, the substrate is selected from the group consisting of copper foil and nickel foam. In one embodiment, the present invention is a device comprising the electrode. In one embodiment, the device is selected from the group consisting of a solar cell and a fuel cell.

In another aspect, the present invention relates to a method of preparing a catalyst using electrodeposition, wherein the method comprises the steps of: a. immersing a substrate in an aqueous solution comprising cobalt, molybdenum, and phosphorous; b. applying a voltage to the substrate, wherein the catalyst forms a film on at least a portion of the surface of the substrate. In one embodiment, the catalyst forms a film on the surface of the substrate. In one embodiment, the molar ratio between cobalt and molybdenum ranges from about 0.4:0.1 to 1.0:0.5. In one embodiment, the molar ratio between cobalt and molybdenum is about 0.7:0.3. In one embodiment, the total concentration of cobalt and molybdenum in the aqueous solution is about 50 mM. In one embodiment, the voltage ranges from about −1.3 V to −1.6 V. In one embodiment, the voltage is about −1.5 V. In one embodiment, the electrodeposition is performed for a period of time ranging from about 300 seconds to 900 seconds. In one embodiment, the electrodeposition is performed for a period of time of about 600 seconds.

In a further aspect, the present invention relates to a method of producing hydrogen, the method includes the steps of; a. providing a cell comprising an electrode comprising a catalyst of formula I in an aqueous solution; and b. applying a current to the cell, whereby hydrogen is produced at the electrode, wherein in formula I: $Co_xMo_yP$ (formula I), x ranges from about 0.4 to 1.0, and y ranges from about 0.1 to 0.5. In one embodiment, the catalyst is a thin film deposited on at least a portion of the surface of the electrode. In one embodiment, x is about 0.7, and y is about 0.3. In one embodiment, the aqueous solution is an alkaline solution. In one embodiment, the pH of the solution is about 14. In one embodiment, the cell includes one chamber. In one embodiment, the cell further comprises a second electrode. In one embodiment, the cell further comprises a reference electrode.

The present invention also relates to a method of water electrolysis, the method comprising the steps of: a. providing a cell comprising an electrode comprising a catalyst of formula I in an aqueous solution; and b. applying a current to the cell, whereby water is electrolyzed at the electrode, wherein in formula I: $Co_xMo_yP$ (formula I), x ranges from about 0.4 to 1.0, and y ranges from about 0.1 to 0.5. In one embodiment, the catalyst is a thin film deposited on at least a portion of the surface of the electrode. In one embodiment, x is about 0.7, and y is about 0.3. In one embodiment, the aqueous solution is an alkaline solution. In one embodiment, the pH of the solution is about 14. In one embodiment, the cell includes one chamber. In one embodiment, the cell further comprises a second electrode. In one embodiment, the cell further comprises a reference electrode.

The present invention relates in part to a method of producing hydrogen, the method comprising the steps of: a. immersing a substrate in an aqueous solution comprising cobalt, molybdenum, and phosphorous; and b. applying a voltage to the substrate, wherein a catalyst of formula I forms a film on at least a portion of the surface of the substrate: c. removing the first aqueous solution; d. adding an alkaline solution; and e. applying a current to the substrate, whereby hydrogen is produced, wherein in formula I: $Co_xMo_yP$ (formula I), x ranges from about 0.4 to 1.0, and y ranges from about 0.1 to 0.5. In one embodiment, x is about 0.7, and y is about 0.3. In one embodiment, the pH of the solution is about 14.

In another aspect, the invention relates to a method of water electrolysis, the method comprising the steps of a. immersing a substrate in an aqueous solution comprising cobalt, molybdenum, and phosphorous; and b. applying a voltage to the substrate, a catalyst of formula I forms a film on at least a portion of the surface of the substrate; c. removing the aqueous solution; d. adding an alkaline solution; and e. applying a current to the substrate, whereby water is electrolyzed, wherein in formula I: $Co_xMo_yP$ (formula I), x ranges from about 0.4 to 1.0, and y ranges from about 0.1 to 0.5. In one embodiment, x is about 0.7, and y is about 0.3. In one embodiment, the pH of the solution is about 14.

In another aspect, the inventor relates to a method of producing hydrogen, the method comprising the steps of: a. immersing a substrate in an aqueous solution comprising cobalt, molybdenum, and phosphorous: and b. applying a voltage to the substrate, wherein a catalyst of formula I forms a film on at least a portion of the surface of the substrate; c. removing the substrate from the aqueous solution; d. immersing the substrate in an alkaline solution; and e. applying a current to the substrate, whereby hydrogen is produced, wherein in formula I: $Co_xMo_yP$ (formula I), x ranges from about 0.4 to 1.0. and y ranges from about 0.1 to 0.5. In one embodiment, x is about 0.7, and y is about 0.3. In one embodiment, the pH of the solution is about 14.

The present invention relates, in part, to a method of water electrolysis, the method comprising the steps of; a. immersing a substrate in an aqueous solution comprising cobalt, molybdenum, and phosphorous; and b. applying a voltage to the substrate, wherein a catalyst of formula I forms a film on at least a portion of the surface of the substrate; c. removing the substrate from the aqueous solution; d. immersing the substrate in an alkaline solution: and e. applying a current to the substrate, whereby water is electrolyzed, wherein in formula I: $Co_xMo_yP$ (formula I), x ranges from about 0.4 to 1.0, and y ranges from about 0.1 to 0.5. In one embodiment, x is about 0.7, and y is about 0.3. In one embodiment, the pH of the solution is about 14.

The present invention further relates, in part, to a system for producing hydrogen, the system comprising: a cell for generating electricity, wherein the cell comprises an electrode comprising a catalyst of formula I, wherein the electricity electrolyzes water at the electrode to produce hydrogen, wherein in formula I: $Co_xMo_yP$ (formula I), x ranges from about 0.4 to 1.0. and y ranges from about 0.1 to 0.5. In one embodiment, x is about 0.7, and y is about 0.3. In one embodiment, the cell is a solar cell.

DETAILED DESCRIPTION

The present invention relates to the unexpected discovery that multi-metal catalysts comprising certain molar ratios of cobalt to molybdenum (present along with phosphorous) exhibit improved properties over known catalysts for generating hydrogen from the electrolysis of water. For example, the catalysts of the present invention exhibit exceptional catalytic properties for the hydrogen evolution reaction (HER), a key reaction in water splitting technology to produce hydrogen gas. In one embodiment, the catalysts of the present invention are composed of Earth-abundant elements, and exhibit catalytic properties that improve significantly upon the properties of known HER catalysts, such as Ni and cobalt phosphides. The catalysts of the invention also exhibit superior stability in alkaline solutions.

The present invention also relates to the discovery of a novel method for the electrolysis of water, which utilizes the catalysts described herein.

The present invention also relates to methods of preparing the catalysts of the invention.

The present invention also relates to electrodes and devices comprising catalysts of the invention.

Definitions

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

As used herein, the term "overpotential" refers to the potential (voltage) difference between a reaction's thermodynamically determined reduction or oxidation potential and the potential at which the event is experimentally observed.

Ranges: throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Description

The present invention relates to the unexpected discovery that multi-metal catalysts comprising certain molar ratios of cobalt to molybdenum exhibit improved properties over known Earth-abundant catalysts for generating hydrogen from the electrolysis of water. For example, the catalysts of the present invention exhibit exceptional catalytic properties for the hydrogen evolution reaction (HER), a key reaction in water splitting technology to produce hydrogen gas. In one embodiment, the catalysts of the present invention are composed of Earth-abundant elements, and exhibit catalytic properties that significantly improve upon the properties of known HER catalysts, such as those made from Earth-abundant catalysts (see Table 1). The catalysts of the invention were also found to exhibit superior stability in alkaline solutions, in which water electrolysis is typically carried out.

The present invention also relates to methods of preparing the catalysts of the invention. In one embodiment, the catalysts are prepared using electrodeposition methods.

The present invention also relates to the discovery of a novel method for the preparation of hydrogen gas, which utilizes the catalysts described herein.

The present invention also relates to the discovery of a novel method for the electrolysis of water, which utilizes the catalysts described herein.

The ability to generate hydrogen gas for use as a fuel source using green methods is important for developing renewable energy sources. For example, electricity can be generated with a solar cell using only solar radiation, and the electricity can be used to carry out hydrogen gas production via water electrolysis. Therefore, it is desirable to have solar cells that include catalysts that can efficiently electrolyze water to produce hydrogen gas, such as the catalysts of the present invention. Thus, the present invention also includes devices comprising electrodes and/or catalysts of the present invention, such as fuel cells and solar cells.

Catalysts of the Invention

The present invention includes novel multi-metal catalysts. In one embodiment, the catalysts are useful for the hydrogen evolution reaction (HER). The catalysts may be prepared from Earth-abundant metals, which are relatively inexpensive compared to other known HER catalysts, such as platinum. In addition, the catalysts of the present invention were found to exhibit an overpotential of about 25-30 mV at a current density of 10 mA cm. In one embodiment, the catalyst includes cobalt (Co), molybdenum (Mo), and phosphorus (P).

In one embodiment, the catalyst is a catalyst of formula I:

$$Co_xMo_yP \quad \text{(formula I)},$$

wherein:
x ranges from about 0.4 to 1.0, and
y ranges from about 0.1 to 0.5.

As demonstrated by the experimental data described herein, certain molar ratios of cobalt to molybdenum (Co:Mo) were unexpectedly found to exhibit improved properties over other catalysts. In one embodiment, x ranges from about 0.4 to 1.0. and y ranges from about 0.1 to 0.5, wherein x and y represent the molar ratio of Co and Mo, respectively. In another embodiment, x ranges from about 0.5 to 0.9, and y ranges from 0.2 to 0.4. In one embodiment, x is about 0.7, and y is about 0.3.

In some embodiments, the catalysts of the invention are catalyst films. The films may be deposited onto substrates or supports, as would be understood by one of ordinary skill in the art. In one embodiment, the substrate or support is an electrically conducting substrate or support. Non-limiting examples of substrates and supports include ITO (indium-tin oxide), FTO (fluorine doped tin oxide), carbon, steel, stainless steel, copper, titanium, and nickel. Textured substrates can also be used, for example, nickel foam. In one embodiment, the substrate is a copper foil. In another embodiment, the substrate is nickel foam.

The present invention also includes methods of preparing the catalysts described herein. In one embodiment, the catalysts of the invention are prepared using methods of deposition, as would be understood by one of ordinary skill in the art. Non-limiting examples of deposition include painting a slurry carried in organic or inorganic media, slurry spraying onto a hot or cold substrate, spray pyrolysis onto a hot substrate, flame spraying, solution spraying, dipping the substrate into the sol and heating, screen printing, electrolytic deposition, electrodeposition, including electrophoretic deposition, electroplating, and underpotential deposition, physical or chemical evaporation, sputtering. electrostatic spraying, plasma spraying, chemical vapor deposition, molecular beam epitaxy, and laser techniques.

In one aspect, the present invention includes a method of preparing a catalyst, wherein the catalyst is applied to the surface of a substrate using a method of deposition. In one embodiment, the method of deposition is electrodeposition, as would be understood by one of ordinary skill in the art. Using electrodeposition methods, the inventive catalysts can be prepared in situ preparation of the inventive catalysts at the prescribed ratio, and can be prepared in minutes, as opposed to other methods which can take hours or days. Moreover, the ease with which electrodeposition can be used to prepare the catalysts results in a scalable production method, which can be easily adapted for preparation on an industrial scale. Use of electrodeposition also permits control over the concentration of metals in the catalyst following deposition.

Electrodeposition of the catalysts of the invention may be carried out by any of a number of processes known to those skilled in the art. As would be understood by one of ordinary skill in the art, using electrodeposition, the catalyst forms a film or coating on the surface of the substrate.

In one embodiment, the method of preparing a catalyst using electrodeposition comprises the steps of:
a. immersing a substrate in an aqueous solution comprising cobalt, molybdenum, and phosphorous; and
b. applying a voltage to the substrate, wherein the catalyst forms a film on at least a portion of the surface of the substrate.

In one embodiment, the aqueous solution comprising cobalt, molybdenum, and phosphorus may be prepared by adding appropriate amounts of compounds comprising each of the respective elements. Non-limiting examples of suitable compounds comprising molybdenum include $MoCl_5$, $Na_2MoO_4$, $(NH_4)_6Mo_7O_{24}$, $(NH_4)_2MoO_4$, and the like. In one embodiment, the compound is $MoCl_5$. Non-limiting examples of suitable compounds comprising cobalt include $CoNO_3$, $CoSO_4$, and the like. In one embodiment, the compound is $CoNO_3$. A non-limiting example of a suitable compound comprising phosphorous is $NaH_2PO_2$. In one embodiment, the aqueous solution is an electrolyte solution. The electrolytes are the electrical conductor which carries the current and completes an electric circuit between two electrodes.

The aqueous solution may comprise additional components which may be adjusted to modify the deposition rate and/or the composition of the catalysts following deposition, as would be understood by one of ordinary skill in the art. Examples of additional components include NaOAc, citrates such as sodium citrate, citrate-ammonium electrolytes such as triammonium citrate, $Na_2SO_4$, $N_2H_4$, and ammonia.

The molar ratio between cobalt and molybdenum in the aqueous solution may be adjusted as necessary in order to control the molar ratio of cobalt and molybdenum in the catalyst after deposition. In one embodiment, the molar ratio between cobalt and molybdenum ranges from about 0.4:0.1 to 1.0:0.5. In another embodiment, the molar ratio between cobalt and molybdenum ranges from about 0.5:0.2 to 0.9:0.4. In another embodiment, the molar ratio between cobalt and molybdenum is about 0.7:0.3.

The total concentration of cobalt and molybdenum in the aqueous solution can be adjusted as necessary. In one embodiment, the total concentration of cobalt and molybdenum ranges from about 1 mM to about 100 mM. In another embodiment, the total concentration of cobalt and molybdenum ranges from about 10 mM to about 60 mM. In one embodiment, the total concentration of cobalt and molybdenum is about 50 mM.

The total concentration of cobalt, molybdenum, and phosphorous in the aqueous solution can be adjusted as necessary. In one embodiment, the total concentration of cobalt, molybdenum, and phosphorous ranges from about 1 mM to about 100 mM. In another embodiment, the total concentration of cobalt, molybdenum, and phosphorous ranges from about 10 mM to about 60 mM. In one embodiment, the total concentration of cobalt. molybdenum, and phosphorous is about 50 mM.

The voltage may be adjusted to achieve the desired rate of deposition on the substrate, as would be understood by one of ordinary skill in the art. In one embodiment, the voltage ranges from about −0.50 V to −2.5 V. In one embodiment, the voltage ranges from about −1.0 V to −2.0 V. In one embodiment, the voltage ranges from about −1.3 V to −1.6 V. In one embodiment, the voltage ranges from about −1.4 V to −1.5 V. In one embodiment, the voltage is about −1.5 V.

The electrodeposition may be performed for an appropriate period of time. In one embodiment, the electrodeposition is performed for a period of time ranging from about 30 seconds to 6000 seconds. In one embodiment, the electrodeposition is performed for a period of time ranging from about 60 seconds to 3000 seconds. In one embodiment, the electrodeposition is performed for a period of time ranging from about 120 seconds to 1500 seconds. In one embodiment, the electrodeposition is performed for a period of time ranging from about 300 seconds to 900 seconds. In one embodiment, the electrodeposition is performed for a period of time of about 600 seconds.

The present invention also includes electrodes comprising the catalysts of the invention. In one embodiment, the electrode includes a substrate and the catalyst, wherein the catalyst is deposited on the surface of the substrate. In one embodiment, the catalyst is deposited on at least a portion of the surface of the substrate. Any high surface area electrically conducting material is contemplated as a substrate in the present invention. In one embodiment, the substrate or support is an electrically conducting substrate or support. Non-limiting examples of substrates and supports include ITO (indium-tin oxide), FTO (fluorine doped tin oxide), carbon, steel, stainless steel, copper, titanium, and nickel. Textured substrates can also be used, for example, nickel foam. In one embodiment, the substrate is a copper foil. In another embodiment, the substrate is nickel foam.

The present invention also includes devices comprising catalysts and/or electrodes of the present invention. Non-limiting examples of devices include cells such as electrochemical cells, fuel cells (which includes both a non-rechargeable fuel cell and a rechargeable fuel cell), solar cells, direct methanol fuel cells and metal/air rechargeable cells such as Zn/air cells, batteries, solar panels, and redox flow batteries. In one embodiment, the device is a cell. In one embodiment, the device is selected from the group consisting of a fuel cell and a solar cell.

Methods of Use

The present invention includes methods of performing electrochemical processes using the catalysts invention. Non-limiting examples of electrochemical processes include electrolysis of water (water splitting), hydrogen evolution reaction (HER), electroplating, oxidative treatment of organic pollutants, electro-flotation, salt splitting, electrochemical synthesis of organic species, electro-dialysis, metal recovery, metal refining, electrochemical synthesis of pure elements, oxygen reduction as cathodic process, and the oxidation of water to oxygen as an anodic process. In one embodiment, the catalysts of the invention are useful in the hydrogen evolution reaction.

In one aspect, the present invention includes a method of producing hydrogen. In one embodiment, the hydrogen production takes place in a cell on an electrode comprising a catalyst of the invention. In one embodiment, the method includes the steps of:

a. providing a cell comprising an electrode comprising a catalyst of the invention in an aqueous solution; and b. applying a current to the cell, whereby hydrogen is produced at the electrode.

In another aspect, the present invention includes a method of water electrolysis. In one embodiment, the electrolysis takes place in a cell on an electrode comprising a catalyst of the invention. In one embodiment, the method includes the steps of:

a. providing a cell comprising an electrode comprising a catalyst of the invention in an aqueous solution; and b. applying a current to the cell, whereby water is electrolyzed at the electrode. As would be understood by one of ordinary skill in the art, the electrolysis of water using the methods of the invention results in the production of hydrogen gas.

As described herein, the ease with which the catalysts can be deposited on a substrate in combination with the superior activity of the catalysts in producing hydrogen gas demonstrates the commercial viability of the catalysts of the invention. Therefore, the present invention also includes novel methods for producing hydrogen which combine methods of producing the catalysts with previously described methods for producing hydrogen or methods of water electrolysis. In a non-limiting example, after the catalyst is deposited on the substrate, the aqueous solution comprising cobalt, molybdenum, and phosphorus can be replaced with an alkaline solution in order to carry out water electrolysis.

In one aspect, the present invention includes a method of producing hydrogen. The method includes the steps of:

a. immersing a substrate in an aqueous solution comprising cobalt, molybdenum, and phosphorous: and b. applying a voltage to the substrate. wherein a catalyst of the invention forms a film on at least a portion of the surface of the substrate;

c. removing the first aqueous solution:

d. adding an alkaline solution; and e. applying a current to the substrate, whereby hydrogen is produced.

In one aspect, the present invention also includes a method of water electrolysis. The method includes the steps of:

a. immersing a substrate in an aqueous solution comprising cobalt, molybdenum, and phosphorous; and b. applying a voltage to the substrate, wherein a catalyst of the invention forms a film on at least a portion of the surface of the substrate;

c. removing the aqueous solution;

d. adding an alkaline solution; and e. applying a current to the substrate, whereby water is electrolyzed.

In another non-limiting example, after the catalyst is deposited on the substrate, the substrate can be removed from the aqueous solution comprising cobalt. molybdenum, and phosphorous, and immersed in an alkaline solution in order to carry out water electrolysis.

In one aspect, the present invention includes a method of producing hydrogen. The method includes the steps of:

a. immersing a substrate in an aqueous solution comprising cobalt, molybdenum, and phosphorous; and b. applying a voltage to the substrate, wherein a catalyst of the invention forms a film on at least a portion of the surface of the substrate;

c. removing the substrate from the aqueous solution;

d. immersing the substrate in an alkaline solution; and e. applying a current to the substrate, whereby hydrogen is produced.

In one aspect, the present invention also includes a method of water electrolysis. The method includes the steps of:

a. immersing a substrate in an aqueous solution comprising cobalt, molybdenum, and phosphorous; and b. applying a voltage to the substrate, wherein a catalyst of the invention forms a film on at least a portion of the surface of the substrate;

c. removing the substrate from the aqueous solution;

d. immersing the substrate in an alkaline solution; and e. applying a current to the substrate, whereby water is electrolyzed.

In one embodiment, the catalyst is a thin film deposited on at least a portion of the surface of the electrode.

In one embodiment, the electrode is a cathode.

In one embodiment, the cell is a solar cell. In one embodiment, the cell is a fuel cell.

In one embodiment, the current ranges from about 0.10 mA cm$^{-2}$ to 100 mA cm$^{-2}$. In one embodiment, the current ranges from about 1 mA cm$^{-2}$ to 50 mA cm$^{-2}$. In one embodiment, the current ranges from about 5 mA cm$^{-2}$ to 25 mA cm$^{-2}$. In one embodiment, the current is about 10 mA cm$^{-2}$.

In one embodiment, the aqueous solution is an electrolyte solution. In one embodiment, the aqueous solution is an alkaline solution. In one embodiment, the electrode is immersed in the aqueous solution. The pH of the alkaline solution may be adjusted accordingly in order to attain the desired rate of hydrogen production. In one embodiment, the pH of the alkaline solution is about 8 or greater. In one embodiment, the pH of the alkaline solution is about 10 or greater. In one embodiment, the pH of the alkaline solution is about 12 or greater. In one embodiment, the pH of the alkaline solution is about 14 or greater. In one embodiment, the pH of the alkaline solution is about 14.

In one embodiment, the cell includes one chamber. In one embodiment, the cell further includes a second electrode. In one embodiment, the cell further comprises a reference electrode.

Systems

The present invention also includes systems for producing hydrogen. In one embodiment, the system includes a cell for generating electricity. In one embodiment, the cell includes an electrode comprising a catalyst of the invention. In one embodiment, the electricity electrolyzes water at the electrode to produce hydrogen. In one embodiment, the cell is a solar cell.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the catalysts of the invention and practice the claimed methods. The following working examples therefore, specifically point out the preferred embodiments of the present invention, and are not to be construed as limiting in any way the remainder of the disclosure.

Example 1: Preparation of Multi-Metal Phosphorous Films

Method of Preparation of Multi-Metal Phosphorous Films

Catalysts films were prepared by electrodeposition on copper foils/nickel foam. Prior to the electrodeposition, a polished copper foil with a 5 mm diameter was prepared and pasted on to a glassy carbon electrode. Catalysts were also prepared on commercially bought Ni foam. In this case, the Ni foam was cut into 5 mm×5 mm pieces and one side was covered with insulating epoxy so that exposed geometric surface area was 0.25 cm$^2$. Deposition of the novel electrocatalyst on either substrate was carried out at −1.4 V vs. standard Ag/AgCl for 600 seconds using a standard three electrode configuration. A carbon counter electrode was used and Ag/AgCl (sat. KCl) electrode was used as the reference electrode. A series of deposition baths (with variable metal molar ratios Co:Mo) were prepared by adding of 50 mM of metal (various CoNO$_3$ and MoCl$_5$ masses), 0.5 M NaH$_2$PO$_2$, and 0.1 M NaOAc in distilled water.

Results and Discussion

The catalytic performance of the electrodeposited multi-metal films was investigated in 1 M KOH solution. For comparison, the hydrogen evolution reaction (HER) performance of Pt wire was also measured under the same test conditions. As shown in FIG. 1, the Co—Mo phosphorous catalyst film synthesized with molar ratio of 0.70:0.3 of Co:Mo (Co$_{0.70}$Mo$_{0.3}$—P) shows a 0 mV onset overpotential versus the reversible hydrogen electrode (RHE), which is similar to the precious metal platinum (the "gold-standard" of HER catalysts).

Moreover, Co$_{0.70}$Mo$_{0.3}$—P exhibits an overpotential of about 25-30 mV at a current density of 10 mA cm$^{-2}$, which makes this material the most active non-precious metal based alkaline eletrocatalyst reported to date (Table 1). As demonstrated by the data of Table 1, Co$_{0.70}$Mo$_{0.3}$—P was found to exhibit the lowest overpotential when directly compared to other non-precious metal catalysts.

TABLE 1

Comparative data between C$_{0.70}$Mo$_{0.3}$—P and known catalysts.

| Catalyst | Electrolyte | J (mA cm$^{-2}$) | Overpotential (mV) | Reference |
| --- | --- | --- | --- | --- |
| Co$_{0.7}$Mo$_{0.3}$—P | 1M KOH | 10 | 25-30 | — |
| Pt wire | 1M KOH | 10 | 18 | — |
| Co—P film | 1M KOH | 10 | 94 | Angew. Chem. Int. Ed. 2015, 127, 6349 |
| CoP/CC | 1M KOH | 10 | 209 | J. Am. Chem. Soc. 2014, 136, 7587 |
| Co—S/FTO | 1M KOH | 10 | 480 | J. Am. Chem. Soc. 2013, 135, 17699 |
| Co—NRCNTs | 1M KOH | 10 | 370 | Angew. Chem. Int. Ed. 2014, 53, 4372. |

TABLE 1-continued

Comparative data between $Co_{0.70}Mo_{0.3}$—P and known catalysts.

| Catalyst | Electrolyte | J (mA cm$^{-2}$) | Overpotential (mV) | Reference |
|---|---|---|---|---|
| Ni$_2$P | 1M KOH | 20 | 205 | J. Am. Chem. Soc. 2013, 135, 9267. |
| Ni/Ni(OH)$_2$ | 0.1M KOH | 10 | >300 | Angew. Chem. Int. Ed. 2012, 51, 12495. |
| MoB | 0.1M KOH | 10 | 225 | Angew. Chem. Int. Ed. 2012, 51, 12703. |
| MoS$_{2+x}$/FTO | 1M KOH | 10 | 310 | Angew. Chem. Int. Ed. 2015, 54, 667. |
| Amorphous MoS$x$ | 0.1M KOH | 10 | 540 | Chem. Sci. 2011, 2, 1262. |
| FeP Nas/CC | 1M KOH | 10 | 218 | ACS Catal. 2014, 4, 4065. |
| Ni wire | 1M KOH | 10 | 400 | ACS Catal. 2013, 3, 166. |
| Ni$_2$P—G@NF | 1M KOH | 10 | 50 | J. Mater. Chem A. 2015, 3.5, 1941 |

Furthermore, $Co_{0.70}Mo_{0.3}$—P shows excellent stability with continuous operation for 24 hours at 10 mA cm$^2$ also shows no significant performance degradation over 10000 electrochemical cycles (FIG. 2). Additionally, catalyst selectivity towards HER was evaluated using a faradaic efficiency determination and $Co_{0.7}$—$Mo_{0.3}$—P showed a 99% catalytic efficiency (FIG. 3), meaning that 99% of the "electricity" went into making hydrogen gas.

Example 2: Co—Mo—P Based Electrocatalyst for Superior Alkaline Hydrogen Evolution Reaction Methods
Preparation of Co—Mo—P, Co—P and Mo—P Films The catalyst films were prepared by electrodeposition on nickel foam/copper foil. Commercial bought Ni foam/copper foil was cut into 5 mm 5 mm pieces and one side was covered with insulating epoxy so that the exposed geometric surface area was 0.25 cm$^2$. Deposition was carried out at constant potential of –1.4 V vs standard Ag/AgCl for 600 seconds using a standard three electrode configuration. The counter electrode used was carbon and a Ag/AgCl (sat. KCl) electrode was used as the reference electrode. A series of deposition baths (with variable metal molar ratios Co:Mo) were prepared by adding of 50 mM of metal (various CoNO$_3$ and MoCl$_5$ masses), 0.5 M NaH$_2$PO$_2$, and 0.1 M NaOAc in distilled water (Table 2). An example of the labeling scheme used was that for the catalyst resulting from the electrodeposition from a bath comprised of 25 mM Co$^{2+}$ and 25 mM Mo$^{5+}$ was labeled Co$_{0.5}$—Mo$_{0.5}$—P. For the preparation of Co—P catalyst, the deposition bath was prepared by adding 50 mM CoNO$_3$ solution, 0.5 M NaH$_2$PO$_2$. and 0.1 M NaOAc in distilled water. The deposition bath for Mo—P film was prepared by adding 50 mM Na$_2$MoO$_4$ solution, 0.5 M NaH$_2$PO$_2$, and 0.1 M NaOAc in distilled water.

TABLE 2

Concentration of Co$^{2+}$ and Mo$^{5+}$ salt solutions used to prepare Co—Mo—P and Co—P catalysts

| Catalyst | Co concentration (mM) | Mo concentration (mM) |
|---|---|---|
| Co—P | 50 | — |
| Co$_{0.5}$—Mo$_{0.5}$—P | 25 | 25 |
| Co$_{0.6}$—Mo$_{0.4}$—P | 30 | 20 |
| Co$_{0.7}$—Mo$_{0.3}$—P | 35 | 25 |
| Co$_{0.8}$—Mo$_{0.2}$—P | 40 | 10 |

Preparation of Co—Mo Alloy Films

The deposition bath for the Co—Mo alloy was prepared by adding 0.1 M CoNO$_3$, 0.2 M Na$_3$C$_6$H$_5$O$_7$, and 0.005 M Na$_2$MoO$_4$ solution. The electrodeposition was carried out at constant potential of –1.4 V vs standard Ag/AgCl for 600 seconds using a standard three electrode configuration.

Materials characterizations SEM images were obtained using a FEI Quanta 450 FEG microscope operated at 30 kV (see SEM images of Mo—P. Co—Mo, and Co—P alloys in FIG. 4A-C). EDS analysis was performed with an Oxford systems nano-analysis EDS system attached to a FEI Quanta 450 FEG-SEM microscope operating at 30 kV. XRD measurements were carried out by using a Bruker D8 X-ray diffractometer with Cu Kα radiation (λ=0.15406 nm). XPS analysis of the catalysts was carried out using a VG Scientific 100 mm hemispherical analyzer and a Physical Electronics Mg Kα X-ray source operating at 300 W. Elemental analysis was performed using a Thermo Scientific iCAP 7000 Series Inductively Coupled Plasma with an Optical Emission Spectrometer (ICP-OES). Compositions of different catalysts are summarized in Tables 3 and 4.

TABLE 3

Atomic percentages of Co—Mo—P catalysts before and after alkaline HER.

| Sample | Co (%) | Mo(%) | P(%) |
|---|---|---|---|
| Co$_{0.5}$Mo$_{0.5}$P | 66.5 | 23.1 | 10.4 |
| Co$_{0.6}$Mo$_{0.4}$P | 72.4 | 17.3 | 10.3 |
| Co$_{0.7}$Mo$_{0.3}$P | 80.1 | 9.8 | 10.1 |
| Co$_{0.8}$Mo$_{0.2}$P | 84.9 | 5.3 | 9.8 |
| Co$_{0.7}$Mo$_{0.3}$P after HER | 81.2 | 9.4 | 9.4 |

TABLE 4

Atomic percentages of Co—P, Mo—P and Co—Mo alloy catalysts by EDS and ICP-OES

| Sample | Co(%) | Mo(%) | P(%) |
|---|---|---|---|
| Co—P | 91.2 | — | 8.8 |
| Mo—P | 88.4 | — | 11.6 |
| Co—Mo alloy | 75.9 | 24.1 | — |

Electrochemical Tests

Electrocatalytic analysis was carried out using a CHI 660E potentiostat operating in a standard three-electrode configuration at ambient temperature (22±2° C.) in 1 M KOH. All the potentials were measured with respect to a standard calomel (SCE) reference electrode (CH instruments) and a graphite electrode was used as the counter electrode. The potential, measured against a SCE electrode, was converted to the potential versus the reversible hydrogen electrode (RHE) according to, $$E_{RHE}=E_{SCE}+E^0{}_{SCE}+0.059\times pH$$

All the polarization curves were recorded at 0.5 mVs$^{-1}$ scan rate. For all the catalysts tested here, polarization curves were replicated at least 5 times. The overpotential ($\eta$, at a current density of 10 mA cm$^{-2}$) reported are based on an analysis of these data. For Tafel analysis, the HER activity of catalyst was evaluated by collecting steady-state current density (j) as a function of applied potential (E) during hydrogen evolution. The current density—overpotential data were plotted in the form of log j versus q to construct Tafel plots.

The double layer capacitance measurement was carried out using non-aqueous aprotic electrolyte (0.15 M KPF$_6$/CH$_3$CN) at open circuit potential. For each capacitive measurement cyclic voltammetry scans spanning ±50 mV of the open circuit potential was recorded at various scan rates (5, 10, 20, 30, 40, 50 and 60 mVs$^{-1}$). The difference between anodic current and cathodic current (ja-jc) at open circuit potential was used to extract the capacitive current.

Results and Discussion

Alloying or doping different metals into materials which are already catalytically active is a well-known strategy to control the binding and transformation kinetics of key reaction intermediates in catalysis (Bajdich et al., J. Am. Chem. Soc., 2013, 135:13521-13530; Seh et al., Science, 2017, 355). Recent examples of such doping induced catalytic activity modulation include the doping of NiO$_x$/Ni(OH)$_2$ with Fe (Friebel et al., J. Am. Chem. Soc., 2015, 137:1305-1313), NiFe layered double hydroxide with Co (Thenuwara et al., J. Phys. Chem. B, 2018, 122:847-854), and CoFeO$_x$ with W (Zhang et al., Science, 2016, 352:333) for OER. and the doping of CoP/NiP systems with Fe and Mn for HER (Liu et al., ACS Catal., 2017, 7:98-102; Xing et al., J. Mat. Chem. A, 2016, 4:13866-13873). Density functional theory (DFT) based theoretical investigations of these systems suggest that such doping/alloying can effectively tune the energetics of the reaction intermediates; in OER, binding of OOH*, OH* and O* and in HER, binding of H* or H$_2$O (Seh et al., Science, 2017, 355: Zhang et al., Science, 2016, 352:333). The reaction kinetics in alkaline HER takes place via electron-coupled water dissociation (the Volmer step), followed by the reaction between adsorbed hydrogen or between adsorbed hydrogen and water to form molecular hydrogen (Tafel or the Heyrovsky step) (Subbaraman et al., Science, 2011, 334:1256). Thus, the HER activity can be limited by the initial Volmer step or subsequent Tafel/Heyrovsky step depending on the active site. For example, Pt shows optimal proton binding (Tafel/Heyrovsky step), however, it shows a poor water dissociative capability (Volmer step) (Markovica et al., J. Chem. Soc. Faraday Trans., 1996, 92:3719-3725). In the Pt$_3$Ni hybrid system, the alloying between Pt and Ni (a metal which is good at breaking the H—OH bond) influences the energetics of the water dissociative step such that the hybrid system exhibits excellent catalytic performance (Wang et al., Angew. Chem. Int. Ed., 2016, 128:13051-13055: Yu et al., ACS Energy Lett., 2018, 3:237-244). In this regard, substitution of molybdenum (a metal which shows excellent hydrogen binding) (Zhang et al., Energy Environ. Sci., 2016, 9:2789-2793; Zhang et al., Nat. Commun., 2017, 8:15437) with cobalt (an active water dissociation center) (Subbaraman et al., Nat. Mater., 2012, 11:550-557) in amorphous Co—P should lead to improved alkaline HER performance as a close proximity of Co and Mo centers would alter the reaction kinetics to enhance the HER. Motivated by this hypothesis, highly HER active Co—P alloy was doped with molybdenum using MoCl$_5$ as the Mo precursor.

Figure 7:
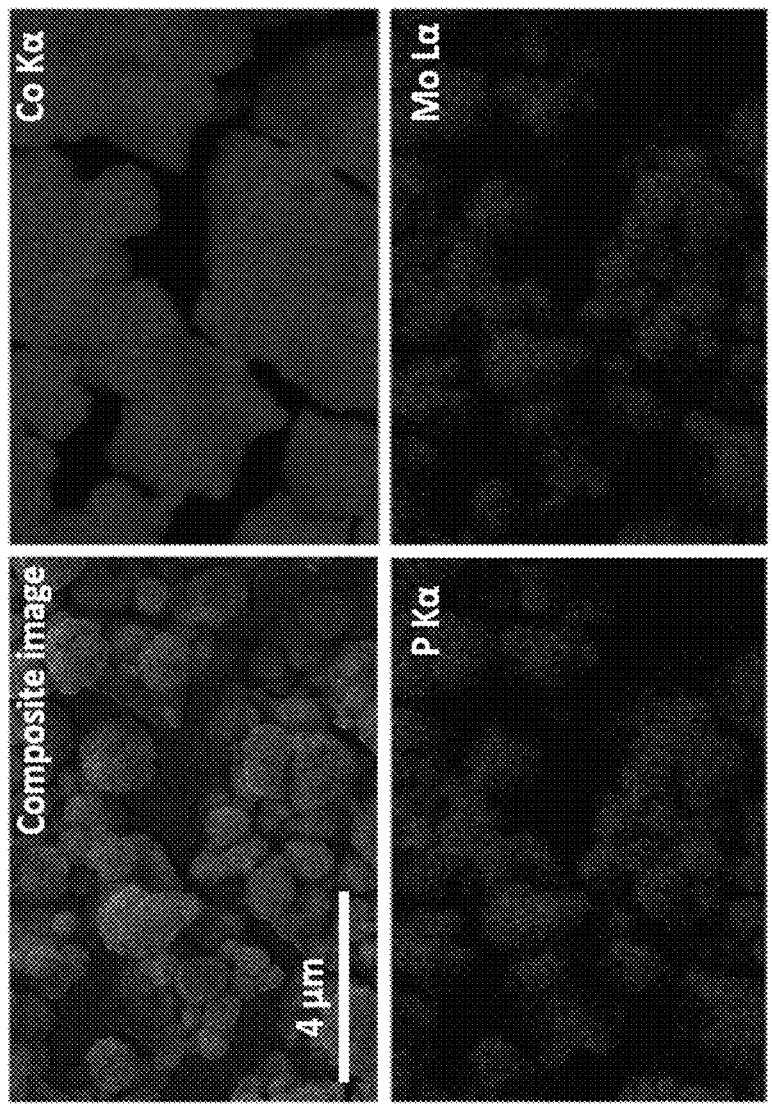
FIG. 7 depicts SEM-Energy dispersive spectroscopy (EDS) elemental maps of $Co_{0.7}$—$Mo_{0.3}$—P.
Figure 8:
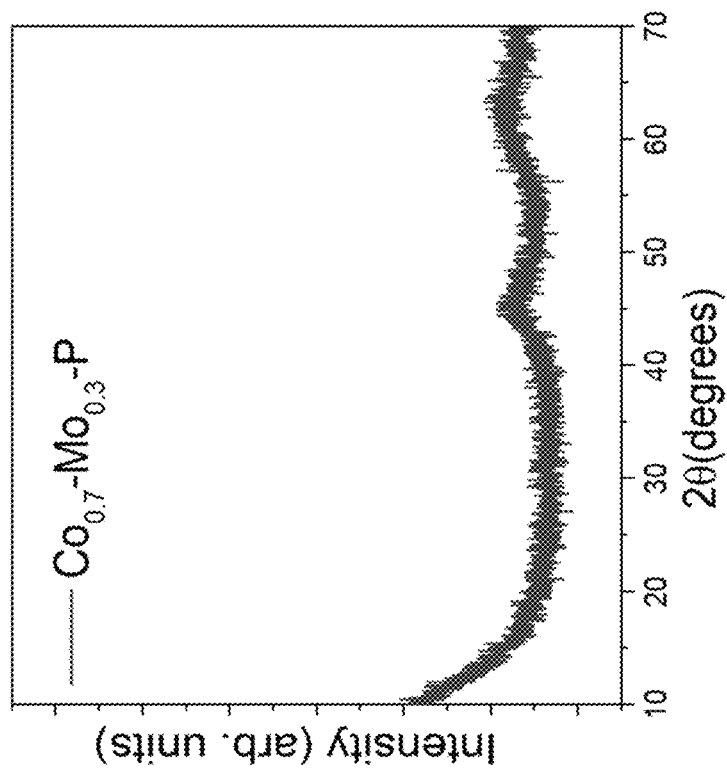
FIG. 8 depicts an experimental X-ray diffraction (XRD) pattern for $Co_{0.7}$—$Mo_{0.3}$—P catalyst. Results suggest the structure of the electrocatalyst is amorphous in nature.
Figure 9:
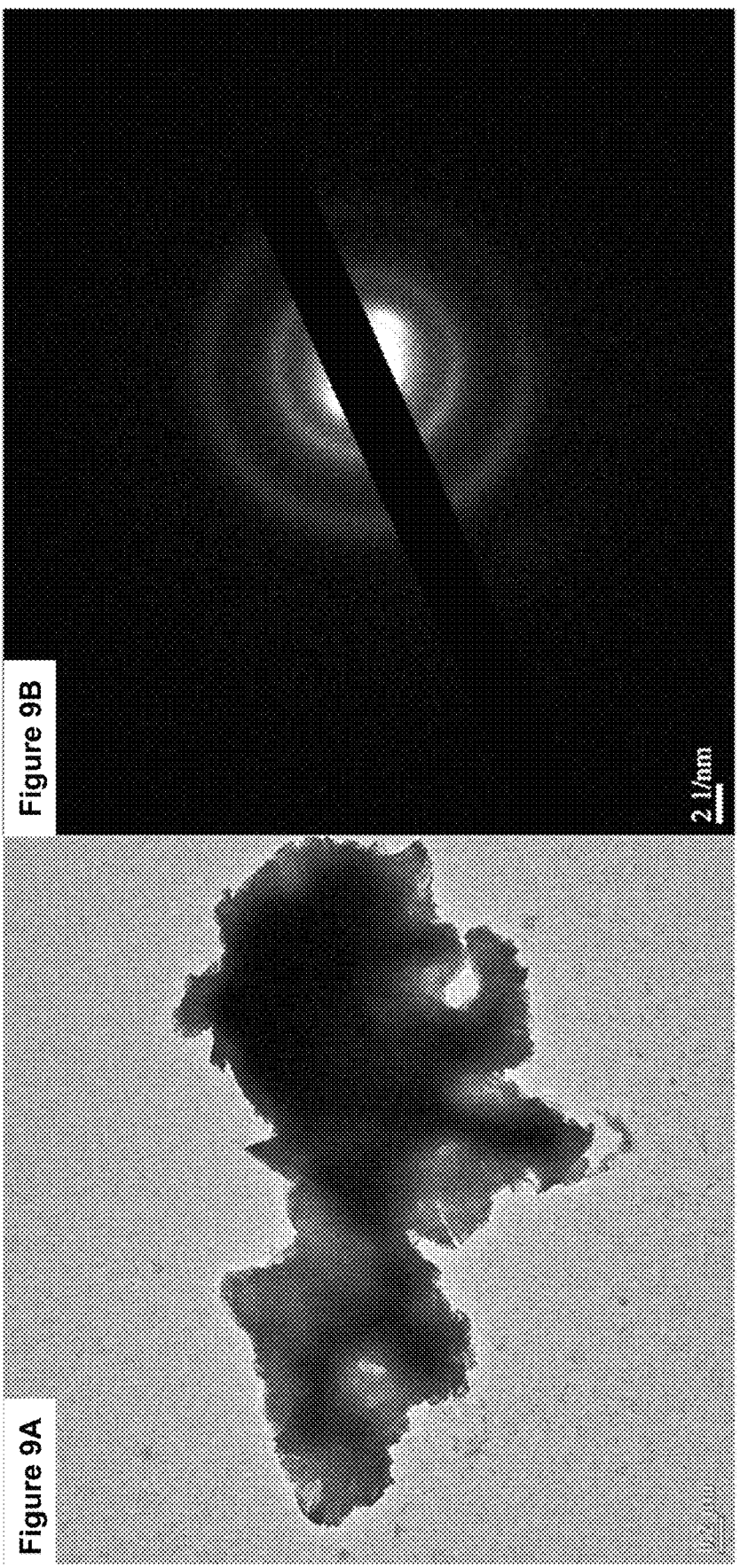
FIG. 9, comprising

The catalyst was synthesized using room temperature electrodeposition on Ni foam/copper foil (geometric surface area-0.25 cm$^2$) where the electrodeposition bath consisted of NaH$_2$PO$_2$, Co(NO$_3$), MoCl$_5$, and C$_2$H$_3$NaO$_2$ (see methods section for more detailed information). By varying the Co to Mo precursor ratio, the degree of Mo doping in the cobalt-molybdenum-phosphorous-derived (Co—Mo—P) alloy was controlled (Table 2). As an example of the labeling of the different samples, the catalytic film resulting when the electrodeposition bath contained a Co to Mo molar ratio of 7:3 was labeled as Co$_{0.7}$—Mo$_{0.3}$—P (and the rest were labeled accordingly). Scanning electron microscopy (SEM) analysis of the catalyst alloys with different Co to Mo ratios showed rough film morphologies with near complete coverage (FIG. 5A-C & FIG. 6) on the supporting copper foil and Ni foam. Elemental analysis using energy dispersive spectroscopy (EDS) and inductively coupled plasma optical emission spectrometry (ICP-OES) confirmed the presence of cobalt, molybdenum and phosphorus, with ~90% of the alloy consisting of metals (Co and Mo) and 10% of phosphorous (FIG. 7, Table 3). The absence of well-defined X-ray diffraction (XRD) peaks (FIG. 8), the presence of diffuse rings and the absence of well-defined diffraction spots in the selected area electron diffraction (SAED) pattern (FIG. 9A-B) obtained from transmission electron microscopy (TEM) are experimental observations that suggest that the electrodeposited Co—Mo—P films are amorphous in nature. X-ray photoelectron spectroscopy (XPS) was employed to investigate the electronic structure of the Co—Mo—P catalyst. The Co 2p region showed two distinct peaks at 778.2 eV (Co 2p$^{3/2}$) and 793.2 eV (Co 2p$^{1/2}$), which is similar to Co 2p XPS of cobalt bound to phosphorous (FIG. 10A) (Grosvenor et al., Inorg. Chem., 2005, 44:8988-8998). The Mo 3d region showed peaks at 228.9 eV (Mo 3d$^{5/2}$) and 231.9 eV (Mo3d$^{3/2}$) which are assigned to molybdenum bound to phosphorous (Xiao et al., Energy Environ. Sci., 2014, 7:2624-2629) (FIG. 10B). The peak at 130.2 eV for the P 2p region can be assigned to metal (Co and Mo) bound phosphorous in the form of metal phosphide (Grosvenor et al., Inorg. Chem. 2005, 44:8988-8998; Ma et al., Energy Environ. Sci., 2017, 10:788-798) (FIG. 10C). To get more insight into the catalyst structure, the distribution of elements (Co, Mo and P) in the Co—Mo—P catalyst was determined with scanning transmission electron microscopy (STEM) and energy dispersive spectroscopy (EDS). The STEM-EDS elemental maps showed a relatively uniform distribution of Co, Mo and P. (FIG. 11A-D).

Figure 12:
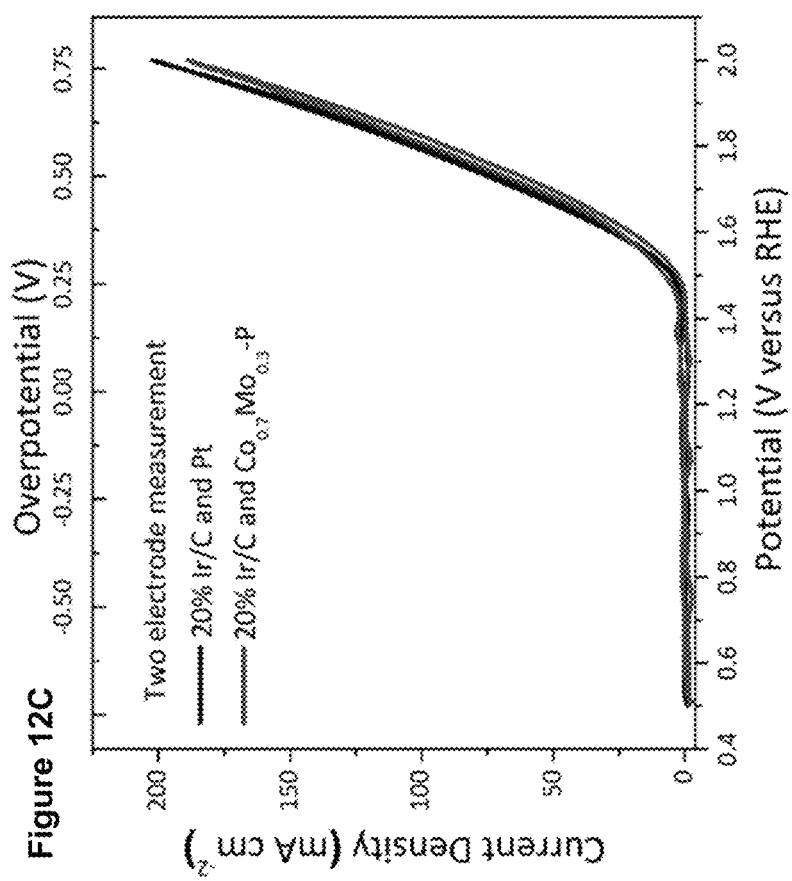
FIG. 12, comprising

The HER performance of Co—Mo—P was investigated in a 1 M KOH solution (pH 14) using linear sweep voltammetry at a scan rate of 0.5 mV s$^{-1}$ (see methods section for details) with a standard three electrode configuration. This low scan rate was chosen to maximize the contribution from faradaic current and minimize capacitive current. To determine the optimum Mo concentration, various catalytic alloy films were electrodeposited with variable Co to Mo ratios. For comparison, the HER performance of Co—P, Mo—P, Co—Mo alloy and platinum wire were also measured under the same test conditions. As shown in FIG. 12A the best catalyst formulation, Co$_{0.7}$—Mo$_{0.3}$—P, showed a negligible, ~0 V, onset potential versus the reversible hydrogen electrode (RHE). This onset overpotential associated with Co$_{0.7}$—Mo$_{0.3}$—P was smaller than that associated with Co—P, Mo—P, Co—Mo alloy, $Co_{0.8}$—$Mo_{0.2}$—P, $Co_{0.6}$—$Mo_{0.4}$—P, $Co_{0.5}$—$Mo_{0.5}$—P, and other alkaline HER catalysts reported to date. Additionally, $Co_{0.7}$—$Mo_{0.3}$—P exhibits the smallest overpotential (25 mV at a current density of 10 mA cm$^2$) and the value is similar to highly actively platinum based HER electrocatalysts (FIG. 12A). The presence of Mo with Co and P results in an overpotential reduction of about −100 mV relative to a Co—P film, emphasizing the synergy between Mo, Co, and P in the Mo—Co—P HER catalyst. The Tafel slope associated with the Co—Mo—P is 42 mV decadet, which is slightly greater than that of platinum (35 mV decade, FIG. 12B). It is important to mention that the overpotential associated with the amorphous Mo—Co—P catalyst is significantly lower than compositionally similar crystalline electrocatalysts that have been studied in prior research. For example, prior studies show that a Co—Mo—P nanocrystal coated by a few-layer N-doped carbon shell exhibited an overpotential of 83 mV at 10 mA cm$^2$, in 1 M KOH (Ma et al., Energy Environ. Sci., 2017, 10:788-789) and Mo doped CoP (Fang et al., Royal Soc. Open Sci., 2017, 4) nanoparticles exhibited an overpotential of −150 mV at 10 mA cm$^2$, in 0.5 M $H_2SO_4$. This amorphous versus crystalline structural issue is addressed below.

FIG. 12B shows the polarization curve acquired for electrodeposited $Co_{0.7}$—$Mo_{0.3}$—P in a two-electrode configuration. In this configuration $Co_{0.7}$—$Mo_{0.3}$—P was used as the reducing electrode (0.5 mg cm$^{-2}$ mass loading) and the commercially available 20% Ir/C was used as the oxidizing electrode. As a control, a Pt/C electrode with the same catalyst loading (0.5 mg cm$^{-2}$) was used. The results show that Co—Mo—P catalyst shows a similar activity to Pt/C, where overall water splitting current of 10 mA cm$^2$ was obtained at an overpotential of 290 mV. The majority of this 290 mV overpotential arises from the 20% Ir/C catalyst, as Co—Mo—P shows a much smaller HER overpotential.

Figure 3:
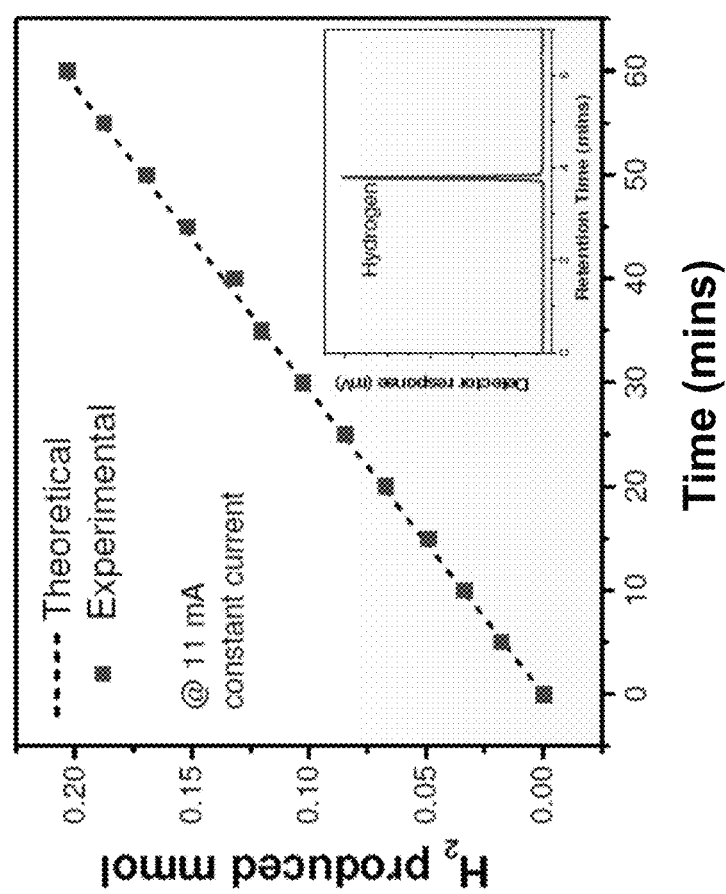
FIG. 3 depicts a graph of experimental data demonstrating $H_2$ evolution from $Co_{0.7}Mo_{0.3}$—P film as a function of electrolysis time at constant electric current of 11 mA. The inset shows the detector response from gas chromatograph verifying the evolved gas is hydrogen.
Figure 6:
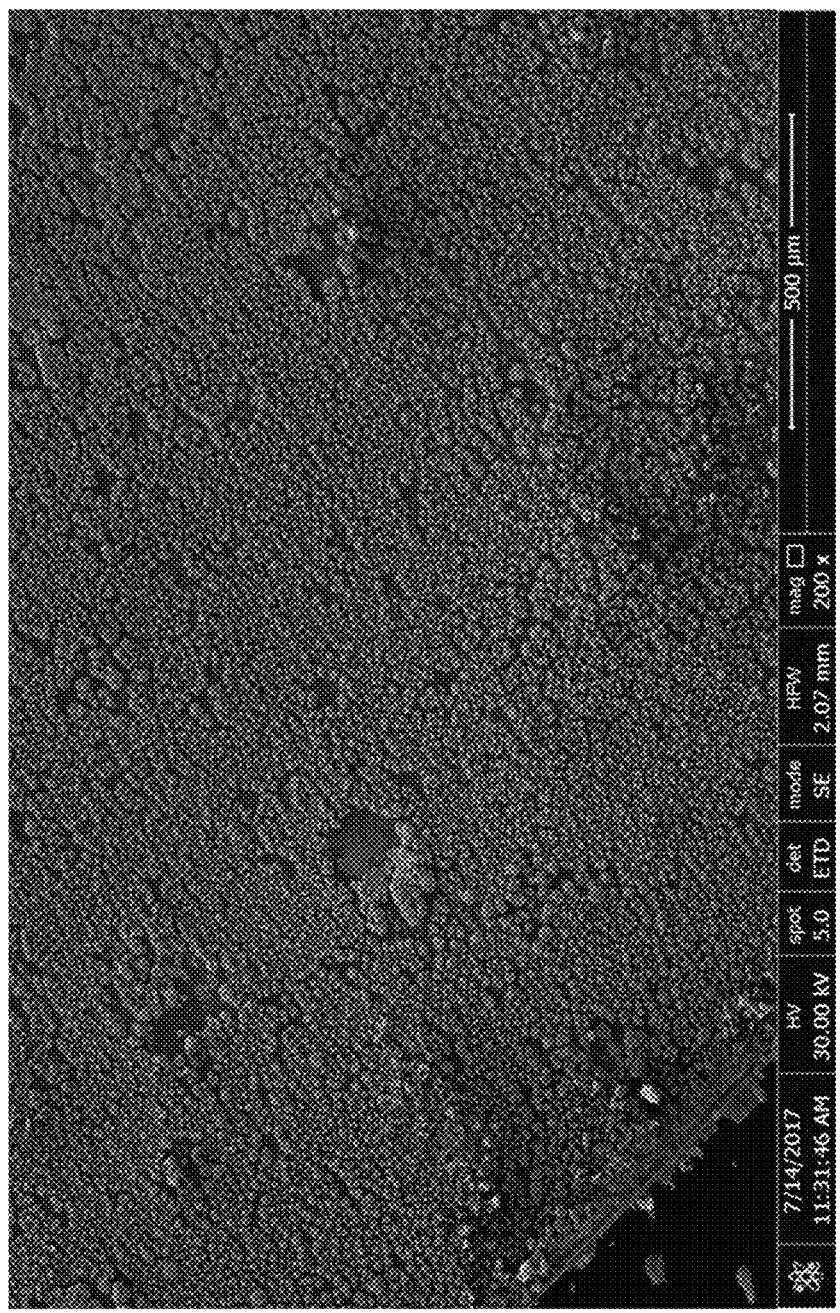
FIG. 6 depicts an SEM image of a $Co_{0.7}$—$Mo_{0.3}$—P catalyst on copper foil which shows near complete coverage of the rough film.
Figure 13:
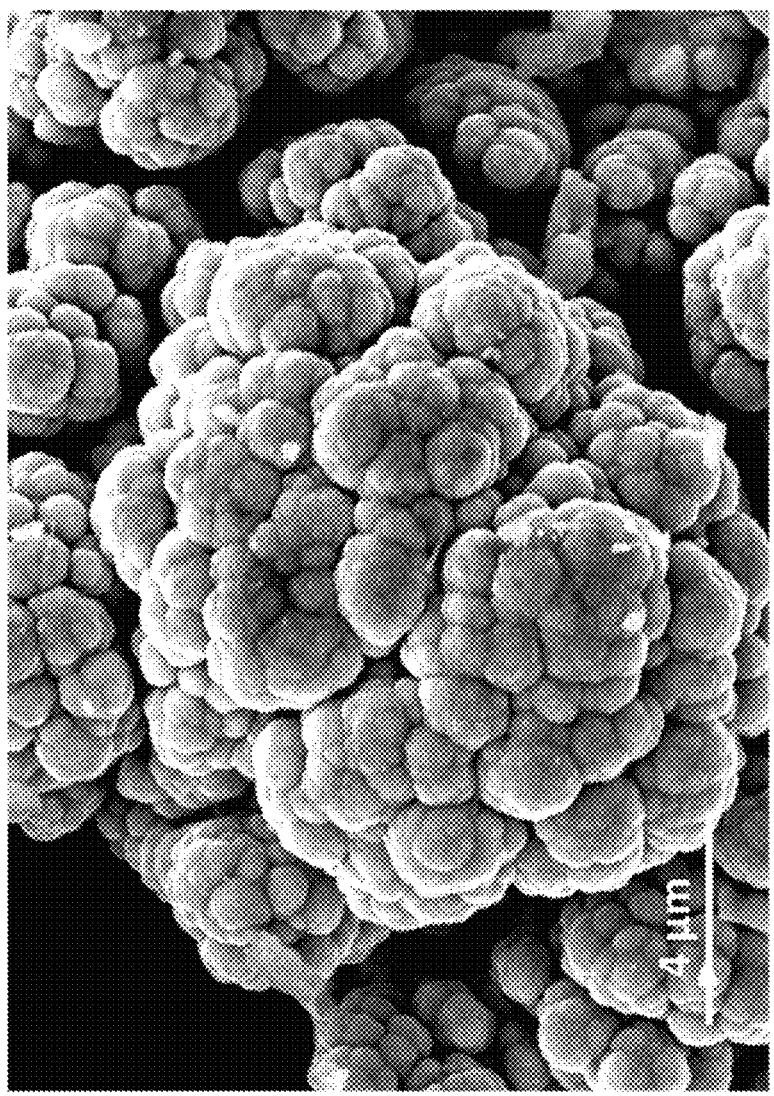
FIG. 13 depicts an SEM image of $Co_{0.7}$—$Mo_{0.3}$—P catalyst after HER.

The stability of the Mo—Co—P catalyst was tested using long term electrocatalytic cycling with cyclic voltammetry (CV) at a scan rate of 50 mV s$^{-1}$. FIG. 12D shows the obtained polarization plots for $Co_{0.7}$—$Mo_{0.3}$—P after performing 1000 and 10000 CVs. The results show a very small increase in overpotential (~7 mV) after 10000 cycles suggesting an excellent stability towards alkaline HER. Furthermore, the stability measurements were complemented by chronopotentiometry, where in this electrochemical mode a constant current of 10 mA cm$^{-2}$ was passed through the catalyst electrode and the overpotential was measured as a function of time. FIG. 12E shows the resulting chronopotentiometric curve for $Co_{0.7}$—$Mo_{0.3}$—P, showing that there was only a negligible increase in overpotential over a time of 24 hours. The selectivity of Co—Mo—P towards alkaline HER was evaluated by performing a faradaic efficiency measurement which resulted in a value of 99%. (FIG. 3). For the faradaic efficiency calculation, controlled electrolysis was carried out using an air tight H-type cell at 30 mV overpotential and the evolved gas ($H_2$) was verified with gas chromatography. The double layer capacitance ($C_{dl}$) of the samples was measured to estimate the electrochemical active surface area using cyclic voltammetry in non-aqueous medium. The use of the non-aqueous medium ensured that the current response resulted only from capacitive charging (non-faradaic) (Yoon et al., J. Am. Chem. Soc., 2018, 140:2397-2400). Ci values for the Co—Mo—P materials ranged from 0.83-1.13 mF while Co—Mo, Co—P and Mo—P samples were associated with $C_{dl}$ values of 0.69, showing that the Co—Mo—P system contained an increased number of reactive sites relative to Co—P, Mo—P and Co—Mo. Moreover, XPS, EDS and SEM investigations were performed on the $Co_{0.7}$—$Mo_{0.3}$—P catalyst after the HER stability test to determine whether there were any morphological and/or chemical changes. SEM micrographs obtained after the stability test showed no change relative to the as-prepared catalyst (FIG. 13). However, EDS analysis showed minor decreases in Mo and P content with respect to cobalt (Table 3). Finally, XPS analysis verified that there was no change in the oxidation state of the constituent metals during HER catalysis (FIG. 10A-C).

In summary, it has been shown that the doping of Co—P with Mo is an effective strategy to tune the catalytic activity of Co—P. The best Mo—Co—P catalyst exhibited an overpotential for HER at a current density of 10 mA cm$^{-2}$ that was 100 mV lower than Co—P. Results show that the introduction of Mo to the Co—P system effectively tunes the energetics of both water dissociation and proton binding in alkaline HER leading to enhancement in the catalytic activity (i.e., lowering of the overpotential). Overall, the Mo doped Co—P catalyst is active (~30-35 mV overpotential at 10 mA cm$^{-2}$), stable (retains activity for over 24 hours) and selective (99%, faradaic efficiency for $H_2$) for alkaline electrocatalytic HER. Furthermore, the use of Earth-abundant metals and easy fabrication make Co—Mo—P a potential replacement for the precious platinum metal catalyst in commercial alkaline electrolyzers.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

The invention claimed is:

1. A catalyst of formula I:

$$Co_xMo_yP \qquad \text{(formula I)},$$

wherein:
  x ranges from about 0.4 to 1.0, and
  y ranges from about 0.1 to 0.5.

2. The catalyst of claim 1, wherein the catalyst is a film applied on a substrate.

3. The catalyst of claim 2, wherein the substrate is selected from the group consisting of copper foil and nickel foam.

4. An electrode comprising a substrate and the catalyst of claim 1, wherein the catalyst is present on at least a portion of the surface of the substrate.

5. The electrode of claim 4, wherein the substrate is selected from the group consisting of copper foil and nickel foam.

6. A device comprising the electrode of claim 4.

7. The device of claim 6, wherein the device is selected from the group consisting of a solar cell and a fuel cell.

8. A system for producing hydrogen from water the system comprising:
  a cell for generating electricity, wherein the cell comprises an electrode comprising the catalyst of claim 1, wherein the electricity electrolyzes water at the electrode to produce hydrogen.

9. The system of claim 8, wherein the cell is a solar cell.

10. A method of water electrolysis or a method of producing hydrogen, the method comprising the steps of:
  a. providing a cell comprising an electrode comprising a catalyst of formula I in an aqueous solution; and b. applying a current to the cell, wherein water is electrolyzed at the electrode and hydrogen is produced, wherein in formula I:

$$Co_xMo_yP \qquad \text{(formula I)},$$

x ranges from about 0.4 to 1.0, and
y ranges from about 0.1 to 0.5.

11. The method of claim 10, wherein the catalyst is a thin film deposited on at least a portion of the surface of the electrode.

12. The method of claim 10, wherein the aqueous solution is an alkaline solution.

13. The method of claim 12, wherein the pH of the alkaline solution is about 10 or greater.

14. The method of claim 10, wherein the cell further comprises a second electrode.

15. The method of claim 10, wherein the step (a) of providing a cell comprises:

1) immersing a substrate in an aqueous solution comprising cobalt, molybdenum, and phosphorus; and
2) applying a voltage to the substrate, wherein a catalyst of formula I forms a film on at least a portion of the surface of the substrate; and
3) either:
   (i) removing the aqueous solution and adding an alkaline aqueous solution; or
   (ii) removing the substrate from the aqueous solution and immersing the substrate in an alkaline aqueous solution;
thereby providing a cell comprising an electrode comprising the substrate and the catalyst of formula I in an alkaline aqueous solution before
(b) applying a current to the substrate, wherein water is electrolyzed and hydrogen is produced.

16. The method of claim 15, wherein the pH of the alkaline aqueous solution is about 10 or greater.

* * * * *